US012593535B2

(12) United States Patent
Iyer et al.

(10) Patent No.: US 12,593,535 B2
(45) Date of Patent: Mar. 31, 2026

(54) FLEXIBLE INORGANIC MICROLED DISPLAY DEVICE AND METHOD OF MANUFACTURING THEREOF

(71) Applicant: The Regents of the University of California, Oakland, CA (US)

(72) Inventors: Subramanian S. Iyer, Los Angeles, CA (US); Goutham Ezhilarasu, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 549 days.

(21) Appl. No.: 18/007,697

(22) PCT Filed: Jun. 1, 2021

(86) PCT No.: PCT/US2021/035213
§ 371 (c)(1),
(2) Date: Dec. 1, 2022

(87) PCT Pub. No.: WO2021/247545
PCT Pub. Date: Dec. 9, 2021

(65) Prior Publication Data
US 2023/0238476 A1 Jul. 27, 2023

Related U.S. Application Data

(60) Provisional application No. 63/033,564, filed on Jun. 2, 2020.

(51) Int. Cl.
*H10H 20/01* (2025.01)
*H01L 23/00* (2006.01)
(Continued)

(52) U.S. Cl.
CPC ........... *H10H 20/018* (2025.01); *H01L 24/24* (2013.01); *H01L 24/82* (2013.01); *H01L 24/95* (2013.01);
(Continued)

(58) Field of Classification Search
CPC ............... H10H 20/018; H10H 20/854; H10H 20/0362; H10H 20/825; H01L 24/24;
(Continued)

(56) References Cited

U.S. PATENT DOCUMENTS

2015/0091167 A1* 4/2015 Geissler .............. B81C 1/00666
438/126
2015/0111364 A1 4/2015 Lei et al.

OTHER PUBLICATIONS

Ezhilarasu et al., "A Heterogeneously Integrated, High Resolution and Flexible Inorganic uLED Display Using Fan-Out Wafer-Level Packaging," 2020 IEEE 70th Electronic Components and Technology Conference (ECTC), IEEE, Jun. 3, 2020, pp. 677-684.
(Continued)

*Primary Examiner* — Samuel A Gebremariam
(74) *Attorney, Agent, or Firm* — Foley & Lardner LLP

(57) ABSTRACT
Example implementations include a method of mass transfer of display elements, by depositing one or more resist layers between one or more display elements disposed on a photoemitting layer, depositing at least one stress buffer layer between the resist layers, removing the resist layer and at least a portion of the photoemitting layer disposed in contact with the resist layers to form resist layer gaps on a wafer substrate, dicing the wafer substrate at the resist layer gaps to form at least one wafer die, separating the wafer substrate from the display elements by irradiation at corresponding first surfaces of the display elements, removing the stress buffer layers from the wafer die, and bonding the portion of the display elements to a first handler substrate at one or more electrode pads of the portion of the display elements.

22 Claims, 33 Drawing Sheets

700

(51) Int. Cl.
  *H01L 25/16* (2023.01)
  *H10H 20/854* (2025.01)
  *H10H 20/825* (2025.01)
(52) U.S. Cl.
  CPC ......... *H01L 25/167* (2013.01); *H10H 20/854*
    (2025.01); *H01L 2224/24137* (2013.01); *H01L*
      *2224/24991* (2013.01); *H01L 2224/95001*
    (2013.01); *H01L 2924/12041* (2013.01); *H10H*
      *20/0362* (2025.01); *H10H 20/825* (2025.01)
(58) Field of Classification Search
  CPC ....... H01L 24/82; H01L 24/95; H01L 25/167;
      H01L 2224/24137; H01L 2224/24991;
      H01L 2224/95001; H01L 2924/12041
  See application file for complete search history.

(56) References Cited

OTHER PUBLICATIONS

Ezhilarasu et al., "High Yield Precision Transfer and Assembly of
GaN uLEDs Using Laser Assisted Micro Transfer Printing," 2019
IEEE 69th Electronic Components and Technology Conference
(ECTC), IEEE, Aug. 26, 2019, pp. 1470-1474.
International Search Report and Written Opinion on International
Application No. PCT/US2021/035213 dated Nov. 15, 2021 (4
pages).
Yoon, et al., "Heterogeneously Integrated Optoelectronic Devices
Enabled by Micro-Transfer Printing," Advanced Optical Materials
3, 10, 2015, pp. 1313-1335.

* cited by examiner

100

120

110

130

200B

200C

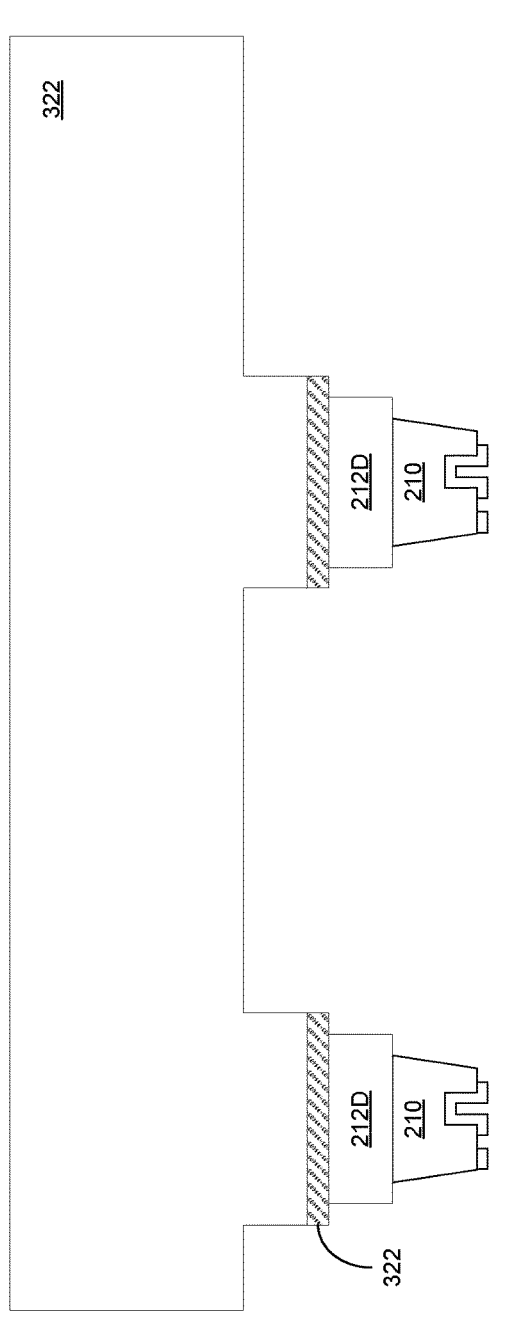
Fig. 4A

500B

Silicon Dielet 512

Silicon Dielet 510

450

430

440

410

412

900

1100

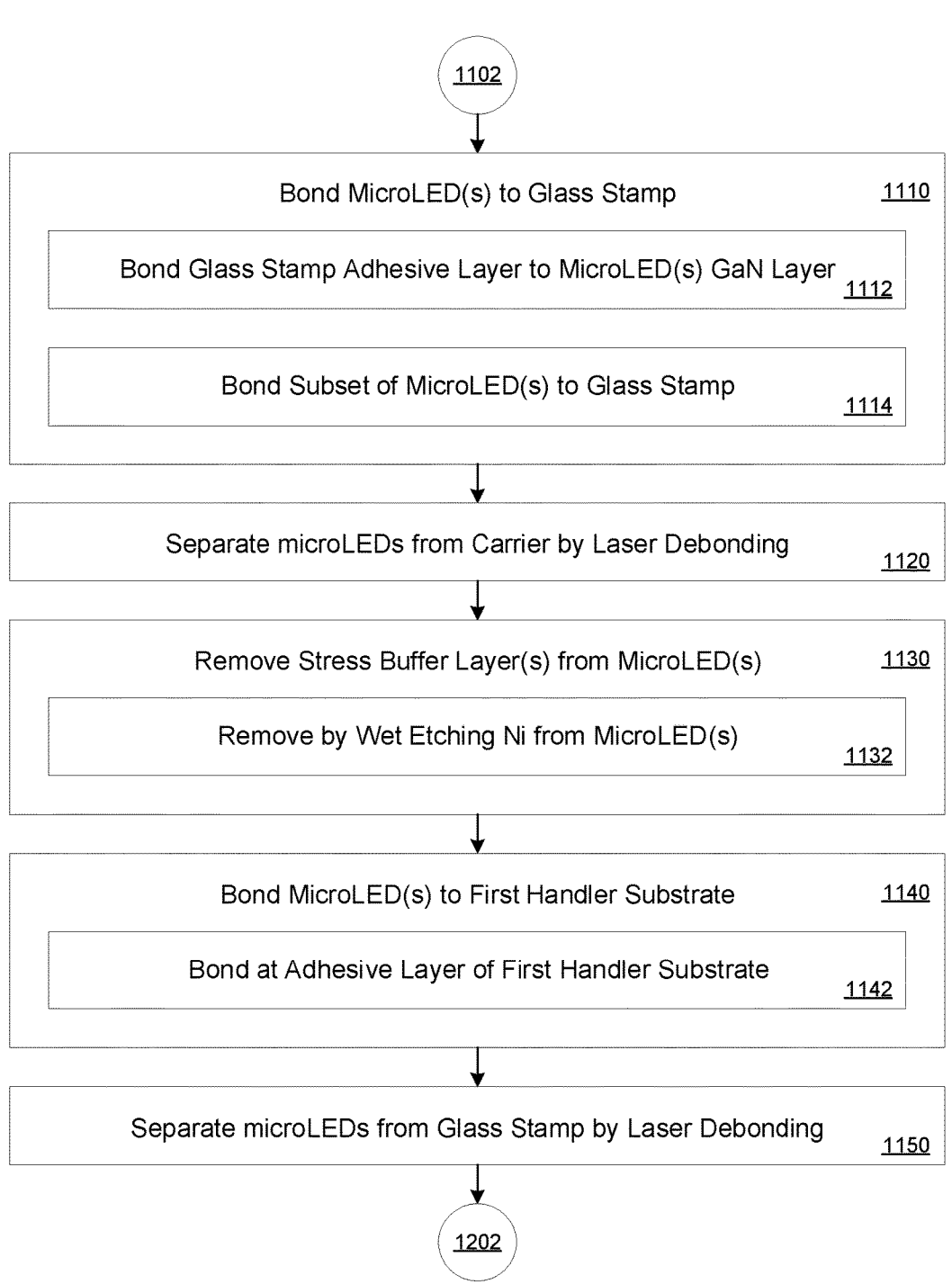

1102

Bond MicroLED(s) to Glass Stamp                                    1110

Bond Glass Stamp Adhesive Layer to MicroLED(s) GaN Layer
1112

Bond Subset of MicroLED(s) to Glass Stamp
1114

Separate microLEDs from Carrier by Laser Debonding
1120

Remove Stress Buffer Layer(s) from MicroLED(s)              1130

Remove by Wet Etching Ni from MicroLED(s)
1132

Bond MicroLED(s) to First Handler Substrate                     1140

Bond at Adhesive Layer of First Handler Substrate
1142

Separate microLEDs from Glass Stamp by Laser Debonding
1150

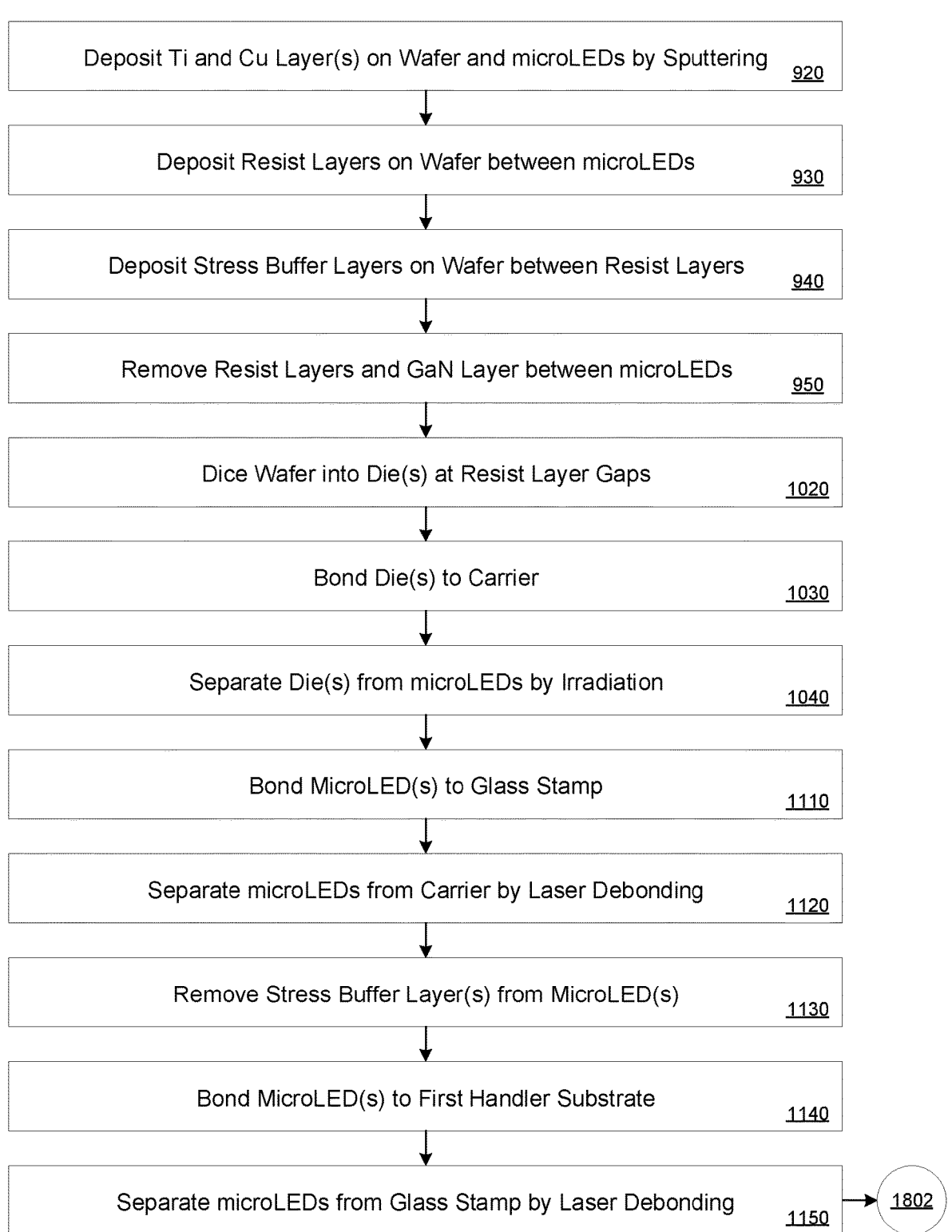

Deposit Ti and Cu Layer(s) on Wafer and microLEDs by Sputtering   920

Deposit Resist Layers on Wafer between microLEDs   930

Deposit Stress Buffer Layers on Wafer between Resist Layers   940

Remove Resist Layers and GaN Layer between microLEDs   950

Dice Wafer into Die(s) at Resist Layer Gaps   1020

Bond Die(s) to Carrier   1030

Separate Die(s) from microLEDs by Irradiation   1040

Bond MicroLED(s) to Glass Stamp   1110

Separate microLEDs from Carrier by Laser Debonding   1120

Remove Stress Buffer Layer(s) from MicroLED(s)   1130

Bond MicroLED(s) to First Handler Substrate   1140

Separate microLEDs from Glass Stamp by Laser Debonding   1150   →  1802

FLEXIBLE INORGANIC MICROLED DISPLAY DEVICE AND METHOD OF MANUFACTURING THEREOF

CROSS-REFERENCE TO RELATED PATENT APPLICATIONS

This application is a National Stage Entry under 35 U.S.C. § 371 of International Application No. PCT/US2021/035213, filed Jun. 1, 2021, which claims priority to U.S. Provisional Patent Application Ser. No. 63/033,564, entitled "APPARATUS FOR FLEXIBLE INORGANIC MICROLED DISPLAYS USING FAN-OUT WAFER-LEVEL PACKAGING," filed Jun. 2, 2020, the contents of such application being hereby incorporated by reference in its entirety and for all purposes as if completely and fully set forth herein.

FEDERALLY SPONSORED RESEARCH OR DEVELOPMENT

This invention was made with government support under Agreement No. HR0011-18-3-0004awarded by the Defense Advanced Research Projects Agency and Development Agreement No. W911NF-10-3-0001 awarded by the U.S. Army Research Laboratory.The government has certain rights in the invention.

TECHNICAL FIELD

The present implementations relate generally to display devices, and more particularly to flexible inorganic microLED display devices.

BACKGROUND

Conventional LEDs at small scale cannot be fabricated directly on flexible organic substrates due to high growth temperatures (e.g., exceeding 900° C.) and lattice matching constraints of compound semiconductor materials. Due to the small desired size and thickness of individual devices at the sub-100 μm and sub-10 μm scales, respectively, sequential pick and place for assembly of such potential LED devices into a display is impractical. Conventional display technology is subject to various disadvantages preventing application into flexible and small scale packages. In particular, conventional manufacturing techniques cannot support heterogeneous LED types and cannot reliably mass transfer or integrate LEDs with other components with sufficiently fine interconnect pitches.

SUMMARY

A die-first Fan-Out Wafer-Level Packaging (FOWLP) process can be used to manufacture high resolution flexible inorganic micro-Light-Emitting-Diode (microLED) displays. As one example, high resolution can be over 200 pixels per inch (PPI). In this process, large arrays of up to millions of individual micron-sized components can be released from a native or growth substrate and can be subsequently integrated heterogeneously with larger mm-sized components (like Si CMOS dielets) in a seamless fashion on a reconstituted or molded flexible transparent substrate. As one example, micron-sized components can include microLEDs with dimensions under 100 μm. These components of sizes at varying orders of magnitude can be interconnected using back-end-of-line (BEOL) electroplated copper redistribution layer (RDL) metallization at very fine pitch. As one example, very fine pitch can be below 20 μm.

The display can be manufactured in both a passive matrix and active matrix configuration with the integration of Si CMOS display driver ICs and Driver micro-ICs respectively. The use of die-first FOWLP can advantageously significantly reduce manufacturing complexity and cost. Specifically, components of greatly varying size, including microLEDs and mm-sized dielets, can be integrated with relative ease by, for example, embedding in a common reconstituted or molded substrate and performing solder-free, low temperature fine-pitch RDL metallization. The proposed process can be used to manufacture high-end, cost-effective flexible microLED displays for the emerging wearable augmented reality (AR) and virtual reality (VR) markets. The use of a bio-compatible substrate like PDMS also advantageously extends this technology to the medical wearables and implants fields for optogenetics and light induced therapeutics. Thus, a technological solution for manufacturing a flexible inorganic microLED display device is provided.

Example implementations include a method of mass transfer of display elements, by depositing one or more resist layers between one or more display elements disposed on a photoemitting layer, depositing at least one stress buffer layer between the resist layers, removing the resist layer and at least a portion of the photoemitting layer disposed in contact with the resist layers to form resist layer gaps on a wafer substrate, dicing the wafer substrate at the resist layer gaps to form at least one wafer die, separating the wafer substrate from the display elements by irradiation at corresponding first surfaces of the display elements, removing the stress buffer layers from the wafer die, and bonding the portion of the display elements to a first handler substrate at one or more electrode pads of the portion of the display elements.

Example implementations include a method of further depositing at least one metallic encapsulating layer on the display elements.

Example implementations include a method where the depositing the resist layers includes depositing the resist layers on the metallic encapsulating layer between display elements.

Example implementations include a method where the depositing the stress buffer layers includes depositing the stress buffer layers on the metallic encapsulating layer between the resist layers.

Example implementations include a method where the depositing the metallic encapsulating layer includes depositing at least one titanium layer on the display elements, and depositing at least one gold layer on the titanium layer.

Example implementations include a method of further bonding the wafer die to a carrier substrate at a first surface of the wafer die, subsequent to the dicing.

Example implementations include a method of further separating the wafer die from the carrier substrate at a second surface of the carrier substrate opposite to the first surface thereof.

Example implementations include a method where the separating the wafer die from the carrier substrate includes separating the wafer die from the carrier substrate by laser debonding.

Example implementations include a method of further bonding at least a portion of the display elements to a stamp substrate at corresponding second surfaces of the display elements opposite to the first surfaces thereof, subsequent to the separating the wafer substrate from the display elements.

Example implementations include a method of further separating the wafer die from the stamp substrate, subsequent to the bonding the wafer die to the first handler substrate.

Example implementations include a method where the separating the wafer die from the stamp substrate includes separating the wafer die from the stamp substrate by laser debonding.

Example implementations include a method where the photoemitting layer includes gallium nitride.

Example implementations include a method where the wafer substrate includes sapphire.

Example implementations include a method where the stress buffer layer includes nickel.

Example implementations include a method where the separating the wafer substrate from the display elements by irradiation includes separating the wafer substrate from the display elements by a laser lift-off process.

Example implementations include a method where the separating the wafer substrate from the display elements by irradiation includes irradiating the photoemitting layer through the sapphire substrate.

Example implementations include a of manufacturing a flexible display device, by bonding at least one silicon die to at least one wafer die including one or more display elements, depositing a flexible layer over the display elements and the silicon die to form a display device structure and a first device structure surface including a surface of the flexible layer, depositing at least one optical stress buffer layer on a second device structure surface opposite to the first device structure surface, and depositing a first interconnect layer on the optical stress buffer layer.

Example implementations include a method of further bonding the display device structure to a second handler substrate at the first device structure surface.

Example implementations include a method of further separating the display device structure from a first handler substrate, subsequent to the depositing the flexible layer, where the wafer die is disposed on the first handler substrate.

Example implementations include a method of further depositing one or more corrugation layers on the second device structure surface between corresponding ones of the portion of the display elements.

Example implementations include a method of further etching one or more contact holes in the optical stress buffer layer on the first device structure surface.

Example implementations include a method of further depositing a dielectric layer on the first interconnect layer.

Example implementations include a method of further etching one or more contact holes in the dielectric layer.

Example implementations include a method of further depositing a second interconnect layer on the first interconnect layer at the contact holes and on the dielectric layer.

Example implementations include a method of further depositing a passivation layer on the second interconnect layer and the dielectric layer.

Example implementations include a method of further bonding the display device structure to a third handler substrate at the second device structure surface, subsequent to the depositing the first interconnect layer.

Example implementations include a method of further separating the display device structure from the second handler substrate at the first device structure surface, subsequent to the bonding the display device structure to the third handler substrate.

Example implementations include a method where the flexible layer includes polydimethylsiloxane (PDMS).

Example implementations include a method where the first interconnect layer includes copper.

Example implementations include a method where the second interconnect layer includes copper.

Example implementations include a method of further depositing an optical structure on the first device structure surface and over at least one of the display elements.

Example implementations include a method where the optical structure includes a lens.

Example implementations include a method where the optical structure includes a waveguide.

Example implementations include a flexible display device with an optical stress buffer layer having a first buffer layer surface and a second buffer layer surface opposite to the first buffer layer surface, a display element disposed on the first buffer layer surface, a silicon die disposed on the first buffer layer surface proximate to the display elements, an interconnect layer disposed on the second buffer layer surface and in contact with at least one of the display element and the silicon die, and a flexible layer disposed on the optical stress buffer layer, the display element, and the silicon die.

Example implementations include a flexible display device with a dielectric layer, where the optical stress buffer layer is disposed on the dielectric layer.

Example implementations include a flexible display device with a passivation layer, where the passivation layer is disposed on the dielectric layer.

Example implementations include a flexible display device with a second interconnect layer, the second interconnect layer being disposed through the dielectric layer.

Example implementations include a flexible display device with an optical structure disposed on the flexible layer and over at least one of the display elements.

Example implementations include a flexible display device where the optical structure includes a lens.

Example implementations include a flexible display device where the optical structure includes a waveguide.

Example implementations include a flexible display device where the flexible layer includes polydimethylsiloxane (PDMS).

BRIEF DESCRIPTION OF THE DRAWINGS

These and other aspects and features of the present implementations will become apparent to those ordinarily skilled in the art upon review of the following description of specific implementations in conjunction with the accompanying figures, wherein:

FIG. 4A illustrates an example first stage of mass transfer of singulated microLED devices to a target substrate, further to the example fourth stage of FIG. 3D.

FIG. 11 illustrates an example method of manufacturing a flexible inorganic microLED display device, further to the example method of FIG. 10.

FIG. 17 illustrates a further example method of manufacturing a flexible inorganic microLED display device, in accordance with present implementations.

DETAILED DESCRIPTION

Figure 1:
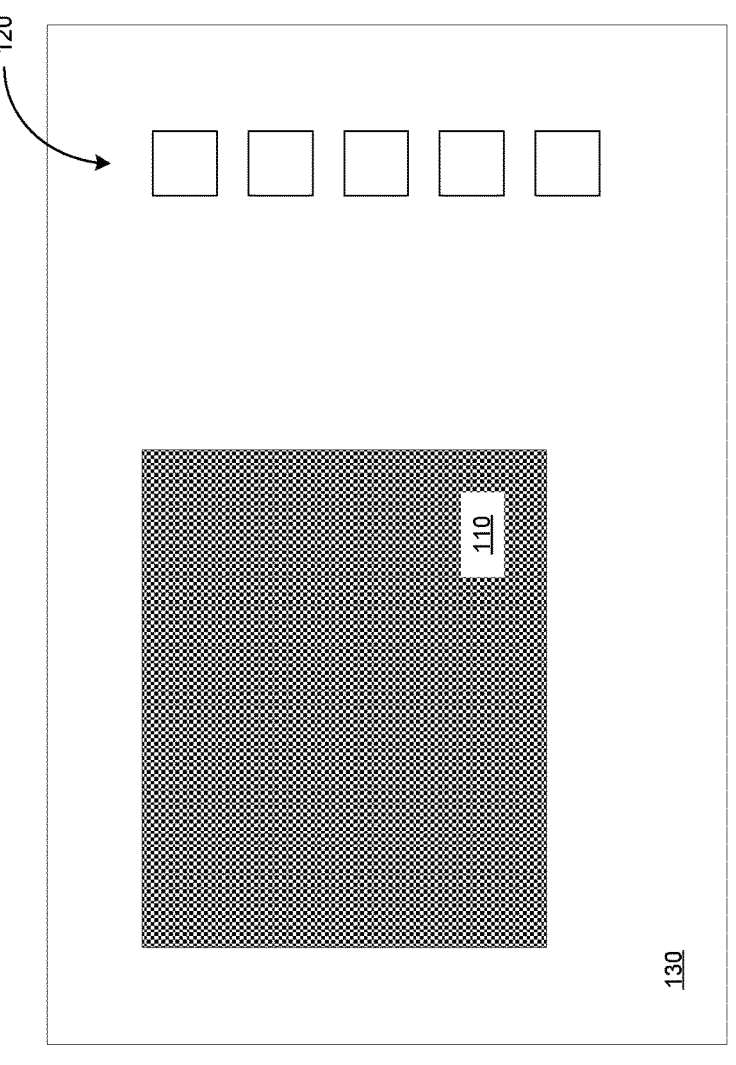
FIG. 1 illustrates an example flexible inorganic microLED display device, in accordance with present implementations.

The present implementations will now be described in detail with reference to the drawings, which are provided as illustrative examples of the implementations so as to enable those skilled in the art to practice the implementations and alternatives apparent to those skilled in the art. Notably, the figures and examples below are not meant to limit the scope of the present implementations to a single implementation, but other implementations are possible by way of interchange of some or all of the described or illustrated elements. Moreover, where certain elements of the present implementations can be partially or fully implemented using known components, only those portions of such known components that are necessary for an understanding of the present implementations will be described, and detailed descriptions of other portions of such known components will be omitted so as not to obscure the present implementations. Implementations described as being implemented in software should not be limited thereto, but can include implementations implemented in hardware, or combinations of software and hardware, and vice-versa, as will be apparent to those skilled in the art, unless otherwise specified herein. In the present specification, an implementation showing a singular component should not be considered limiting; rather, the present disclosure is intended to encompass other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present implementations encompass present and future known equivalents to the known components referred to herein by way of illustration.

Inorganic microLEDs can be grown on rigid substrates, called growth or native substrate, and can be subsequently mass transferred and assembled on a flexible organic substrate using die-first FOWLP. The microLEDs can be heterogeneously integrated with other components like Si CMOS driver ICs to manufacture highly flexible, low form-factor displays.

Present implementations are directed to a mass transfer technique including a thermoplastic laser debondable polyimide based adhesive to attach the microLEDs to a temporary glass carrier before a laser lift-off (LLO) process. The same adhesive deposited on a lithographically patterned glass 'stamp' can be used to transfer print selected arrays of laser debonded microLEDs from the temporary carrier to the final target substrate. Before the release process, the microLEDs can also be protected using an electroplated Ni layer. The Ni can act as a shock absorbing layer during the high-stress LLO process, thus preventing device cracking or surface damage. Manufacturing methods in accordance with present implementations can thus advantageously achieve transfer yields of greater than 99%, while minimizing registration errors of assembled microLED devices and arrays.

FIG. 1 illustrates an example flexible inorganic microLED display device, in accordance with present implementations. As illustrated by way of example in FIG. 1, an example flexible inorganic microLED display device 100 includes a microLED array 110 and silicon dies 120 disposed in a flexible substrate 130.

The microLED array 110 includes multiple microLEDs operable to emit light of various wavelengths, ranges of wavelengths, and the like. MicroLEDs can be based on compound semiconductor material systems like GaN, InP or GaAs and grown on lattice matched substrates at high temperatures using metal oxide chemical vapor deposition (MOCVD) or high vapor pressure epitaxy (HVPE). The microLED array can include red, blue and green microLEDs operable to respectively emit red, blue and green light. The microLED array 110 can thus generate full-color images by coordinated operation of the red, blue and green microLEDs. The microLED array can also display monochrome or reduce-spectrum color by including a subset of red, blue and green microLEDs. The silicon dies 120 include one or more silicon devices operable to control one or more microLEDs of the microLED array 110. The silicon dies can also be operable to perform other operations for effective operation of the microLED array 110, including communication and the like.

The flexible substrate 130 at least partially encloses one or more of the microLED array 110 and the silicon dies 120. The flexible substrate can be deformable in multiple directions and can allow the microLED array 110 and the silicon dies to be deformed without breaking interconnects therebetween, microLED devices thereof, or the silicon dies 120 themselves. The flexible substrate 130 can be made of any transparent organic molding compound, elastomers, polyimides, and the like. As one example, a transparent organic molding compound can include one or more of such as polydimethylsiloxane (PDMS), and the like.

Figure 2A:
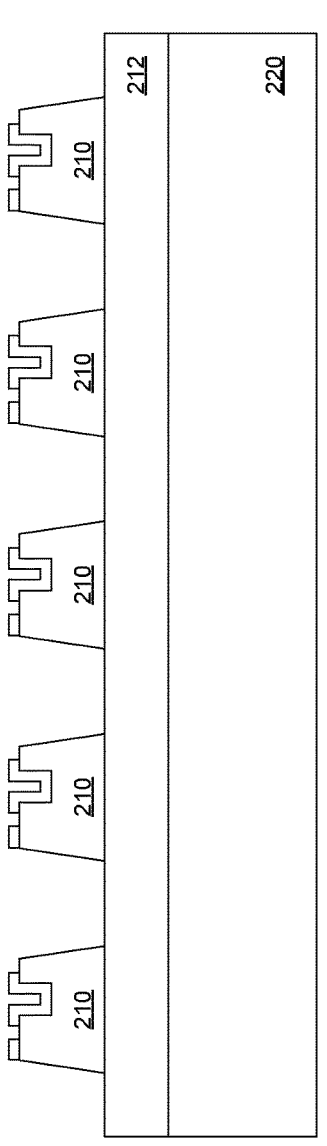
FIG. 2A illustrates an example first stage of singulating a plurality of flexible inorganic microLED devices, in accordance with present implementations.

FIG. 2A illustrates an example first stage of singulating a plurality of flexible inorganic microLED devices, in accordance with present implementations. As illustrated by way of example in FIG. 2A, an example first stage 200A includes microLEDs 210, photoemitting layer 212, and wafer substrate 220. The microLEDs 210 can be obtained prefabricated on the wafer substrate 220, over a photoemitting layer 212. The photoemitting layer 212 can include gallium nitride (GaN), and can be disposed on the wafer substrate 220. The wafer substrate can include sapphire. The microLEDs 210 can be identical, and can be operable to produce a corresponding wavelength. As one example, the microLEDs 210 can all be operable to emit red light. As another example, the microLEDs 210 can all be operable to emit blue light. As another example, the microLEDs 210 can all be operable to emit green light. The photoemitting layer 212 can correspond to a wavelength associated with the microLEDs 210.

Figure 2B:
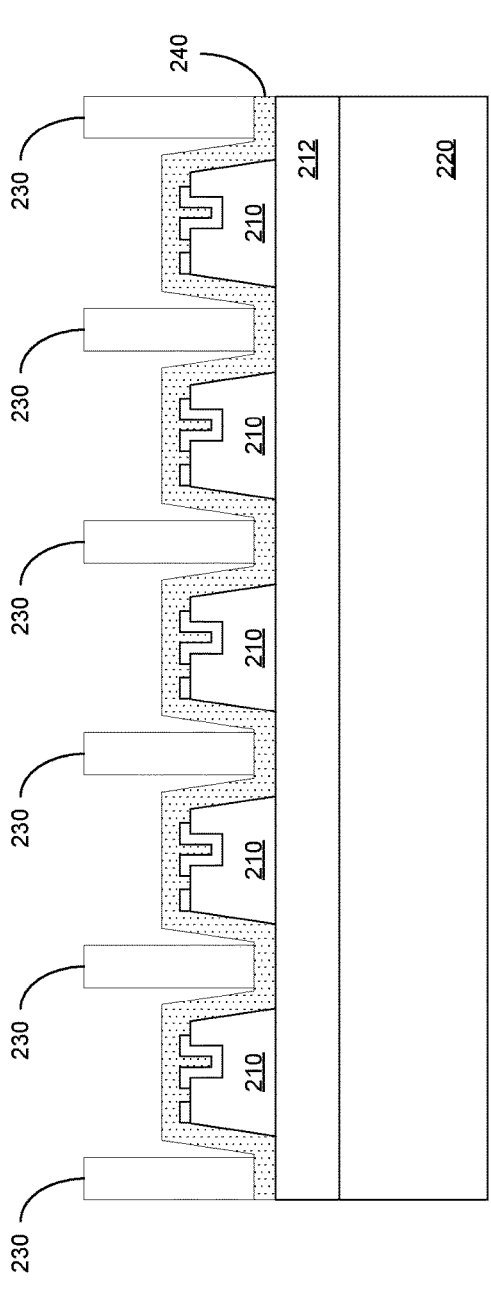
FIG. 2B illustrates an example second stage of singulating a plurality of flexible inorganic microLED devices, further to the example first stage of FIG. 2A.

FIG. 2B illustrates an example second stage of singulating a plurality of flexible inorganic microLED devices, further to the example first stage of FIG. 2A. As illustrated by way of example in FIG. 2B, an example second stage 200B includes the microLEDs 210, the photoemitting layer 212, the wafer substrate 220, resist layers 230, and a encapsulating layer 240. The resist layers 230 is disposed on the encapsulating layer 240 and between the microLEDs 210. The resist layers 230 can be a wall, ring, post, or the like, and can be a container for a material to be deposited on the stress buffer layer 230. As one example, the resist layers can have a height of substantially 10 μm. The encapsulating layer 240 is disposed over the microLEDs 210 and the photoemitting layer 212. The encapsulating layer 240 can be a protective layer to shield the microLEDs 210 from stresses associated with deposition of additional layers thereon.

Figure 2C:
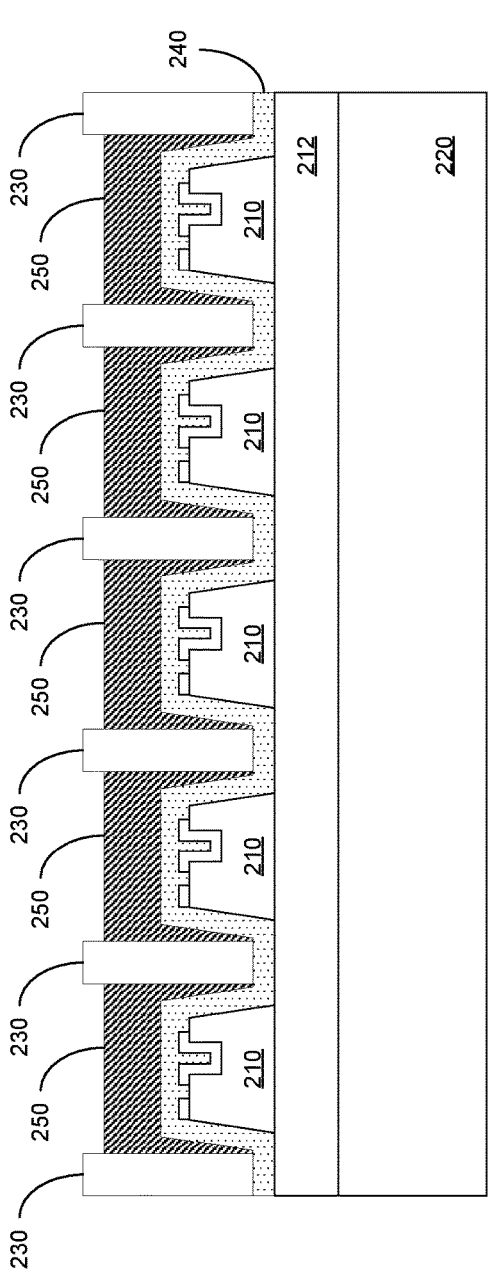
FIG. 2C illustrates an example third stage of singulating a plurality of flexible inorganic microLED devices, further to the example second stage of FIG. 2B.

FIG. 2C illustrates an example third stage of singulating a plurality of flexible inorganic microLED devices, further to the example second stage of FIG. 2B. As illustrated by way of example in FIG. 2C, an example third stage includes the microLEDs 210, the photoemitting layer 212, the wafer substrate 220, the resist layers 230, the encapsulating layer 240, and stress buffer layers 250. The stress buffer layers 250 are disposed between the resist layers 230 and over the encapsulating layer 240. As one example, the stress buffer layers can include nickel. A nickel stress buffer layer can advantageously protect the microLED underneath from temperature, chemical, and mechanical stresses associated with mass transfer of the microLED to a final assembly position.

Figure 2D:
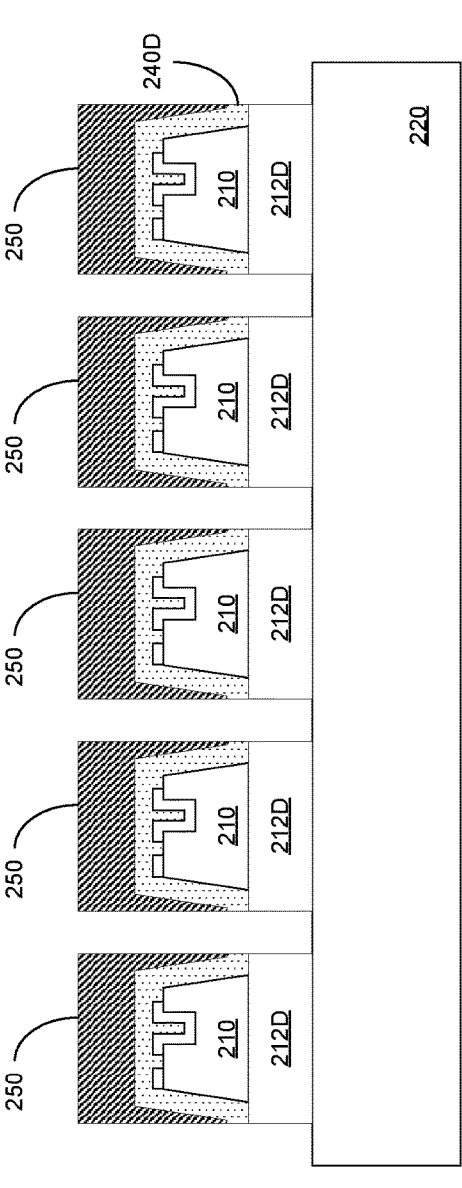
FIG. 2D illustrates an example fourth stage of singulating a plurality of flexible inorganic microLED devices, further to the example third stage of FIG. 2C.

FIG. 2D illustrates an example fourth stage of singulating a plurality of flexible inorganic microLED devices, further to the example third stage of FIG. 2C. As illustrated by way of example in FIG. 2D, an example fourth stage 200D includes the microLEDs 210, the wafer substrate 220, the stress buffer layers 250, singulated photoemitting layers 212D, and singulated encapsulating layers 240D. The singulated photoemitting layers 212D are singulated from the photoemitting layer 212 and are associated with a corresponding microLED 210 disposed above the corresponding singulated photoemitting layer 212D. The singulated encapsulating layers 240D are singulated from the encapsulating layer 240 and are associated with a corresponding microLED 210 disposed below the corresponding singulated encapsulating layer 240D.

Figure 3A:
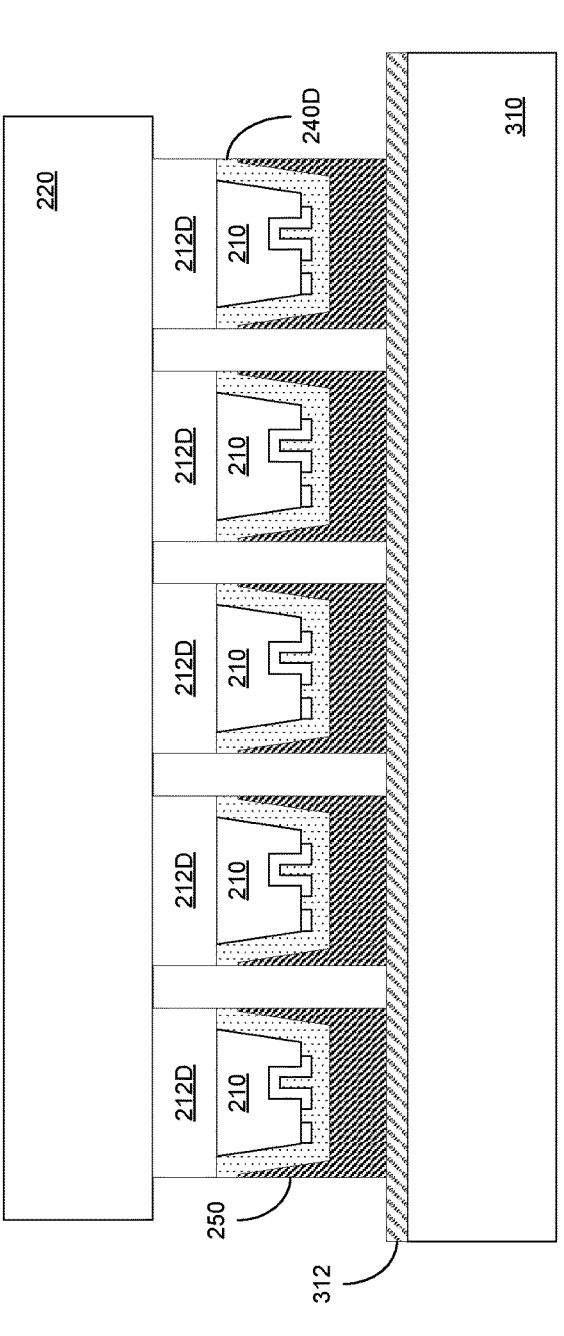
FIG. 3A illustrates an example first stage of mass transfer of singulated microLED devices from a source substrate, further to the example fourth stage of FIG. 2D.

FIG. 3A illustrates an example first stage of mass transfer of singulated microLED devices from a source substrate, further to the example fourth stage of FIG. 2D. As illustrated by way of example in FIG. 3A, an example first stage 300A includes the microLEDs 210, the wafer substrate 220, the stress buffer layers 250, the singulated photoemitting layers 212D, the singulated encapsulating layers 240D, a carrier substrate 310, and an carrier adhesive layer 312 of the carrier substrate. The carrier substrate 310 attaches to the stress buffer layers 250 and inverts the microLEDs 212 and the singulated photoemitting layers 212D by a flip-chip process. The carrier adhesive layer 312 is disposed on the carrier substrate 310 and can bond the carrier substrate 310 to the stress buffer layers 250. The carrier adhesive layer 312 can be thermally released by application of heat.

Figure 3B:
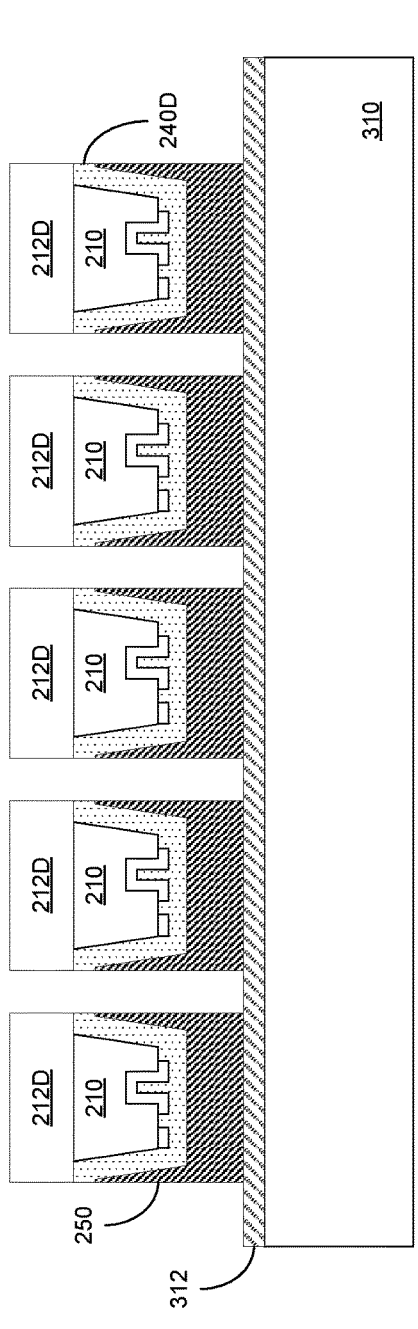
FIG. 3B illustrates an example second stage of mass transfer of singulated microLED devices from a source substrate, further to the example first stage of FIG. 3A.

FIG. 3B illustrates an example second stage of mass transfer of singulated microLED devices from a source substrate, further to the example first stage of FIG. 3A. As illustrated by way of example in FIG. 3B, an example second stage 300B includes the microLEDs 210, the stress buffer layers 250, the singulated photoemitting layers 212D, the singulated encapsulating layers 240D, the carrier substrate 310, and the carrier adhesive layer 312 of the carrier substrate. The wafer substrate 220 is separated from the singulated photoemitting layers 212D. The wafer substrate 220 can be separated from the singulated photoemitting layers 212D by a laser lift-off process in which the singulated photoemitting layers 212D are irradiated through the sapphire of the wafer substrate 220.

Figure 3C:
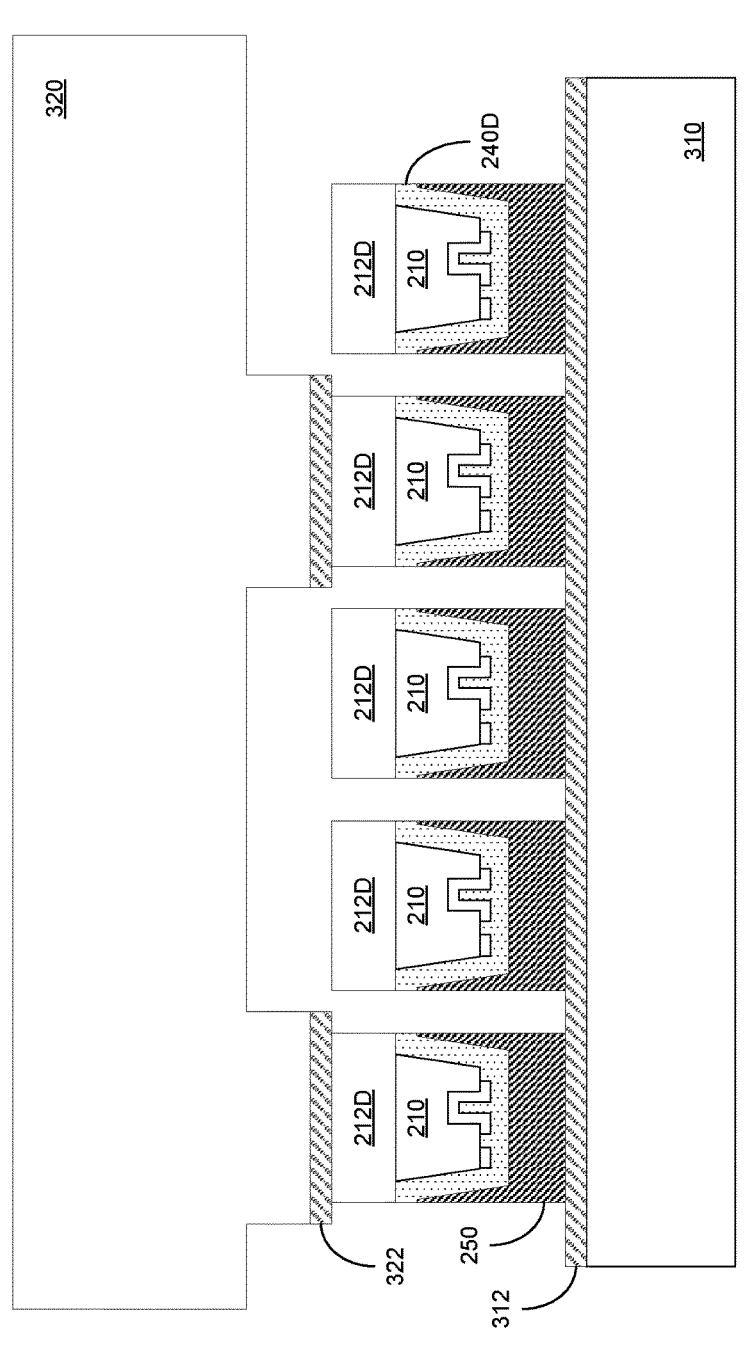
FIG. 3C illustrates an example third stage of mass transfer of singulated microLED devices from a source substrate, further to the example second stage of FIG. 3B.

FIG. 3C illustrates an example third stage of mass transfer of singulated microLED devices from a source substrate, further to the example second stage of FIG. 3B. As illustrated by way of example in FIG. 3C, an example third stage includes the microLEDs 210, the stress buffer layers 250, the singulated photoemitting layers 212D, the singulated encapsulating layers 240D, the carrier substrate 310, the carrier adhesive layer 312 of the carrier substrate, a stamp substrate 320, and a stamp adhesive layer 322. The stamp substrate 320 is bonded to the singulated photoemitting layers 212D by the stamp adhesive layer 322. The stamp adhesive layer 322 is disposed on the stamp substrate 320 and can bond the stamp substrate 320 to the singulated photoemitting layers 212D. The stamp adhesive layer 322 can be released by laser debonding.

Figure 3D:
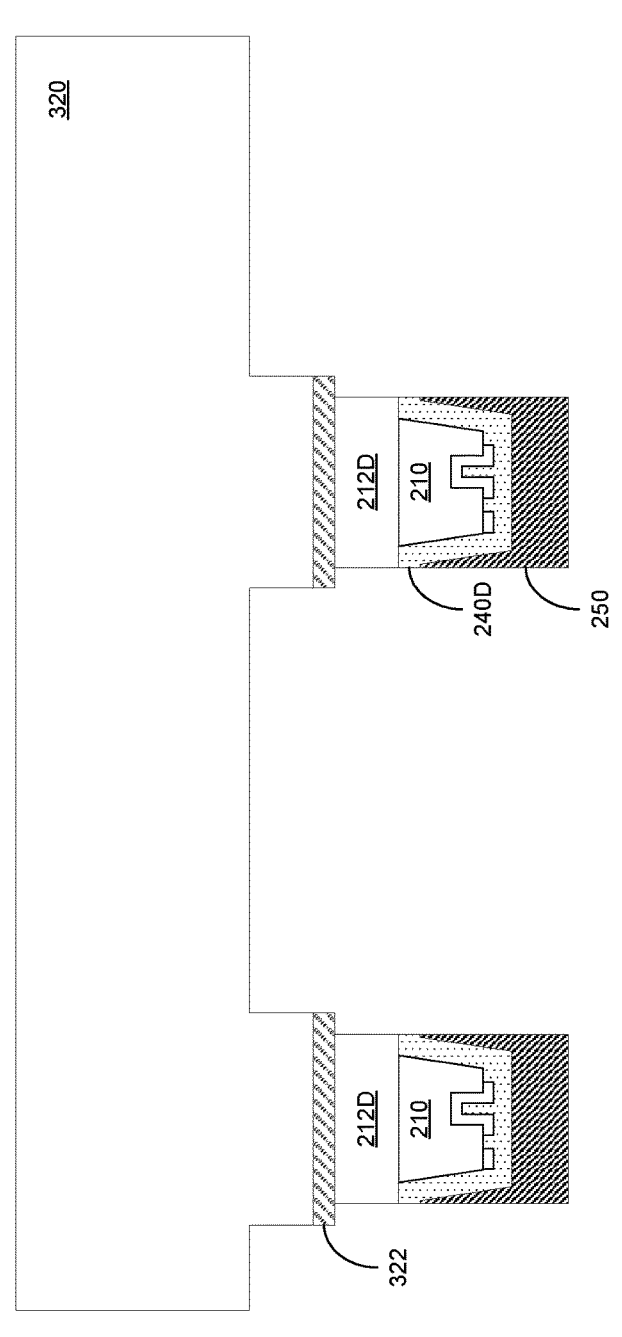
FIG. 3D illustrates an example fourth stage of mass transfer of singulated microLED devices from a source substrate, further to the example third stage of FIG. 3C.

FIG. 3D illustrates an example fourth stage of mass transfer of singulated microLED devices from a source substrate, further to the example third stage of FIG. 3C. As illustrated by way of example in FIG. 3D, an example fourth stage 300D includes the microLEDs 210, the stress buffer layers 250, the singulated photoemitting layers 212D, the singulated encapsulating layers 240D, the stamp substrate 320, and the stamp adhesive layer 322. A subset of the microLEDs 210 can be separated from the carrier substrate 310 and moved by the stamp substrate 320 toward their final assembly position.

FIG. 4A illustrates an example first stage of mass transfer of singulated microLED devices to a target substrate, further to the example fourth stage of FIG. 3D. As illustrated by way of example in FIG. 4A, an example first stage includes the microLEDs 210, the singulated photoemitting layers 212D, the stamp substrate 320, and the stamp adhesive layer 322. The stress buffer layers 250 and the singulated encapsulating layers 240D are removed prior to placement of the microLEDs 210 with their corresponding singulated photoemitting layers 212D.

Figure 4B:
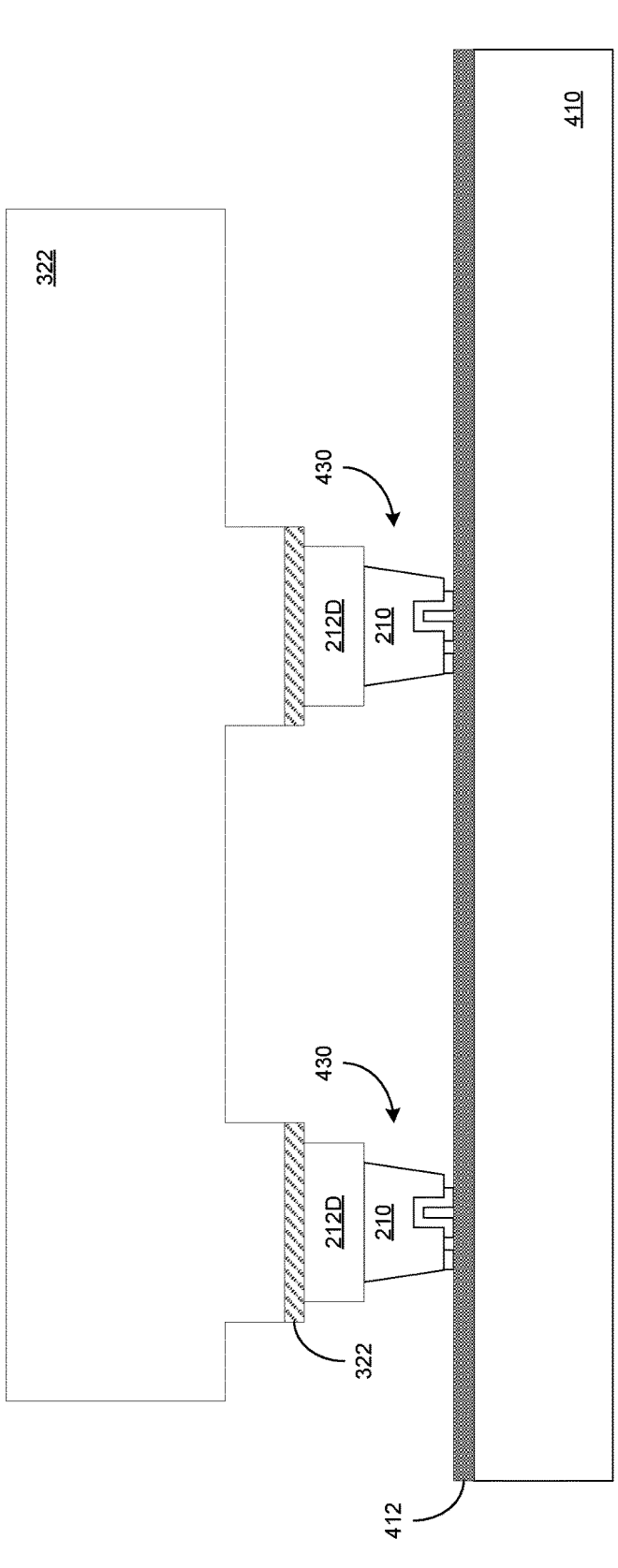
FIG. 4B illustrates an example second stage of mass transfer of singulated microLED devices to a target substrate, further to the example first stage of FIG. 4A.

FIG. 4B illustrates an example second stage of mass transfer of singulated microLED devices to a target substrate, further to the example first stage of FIG. 4A. As illustrated by way of example in FIG. 4B, an example second stage includes the microLEDs 210, the singulated photoemitting layers 212D, the stamp substrate 320, the stamp adhesive layer 322, a first handler substrate 410, and a first handler substrate adhesive layer 412 of the first handler substrate 410. The stamp substrate 320, under operation from a motor, arm, or the like, is moveably placed in contact with the first handler substrate adhesive layer 412 of the first handler substrate 410.

Figure 4C:
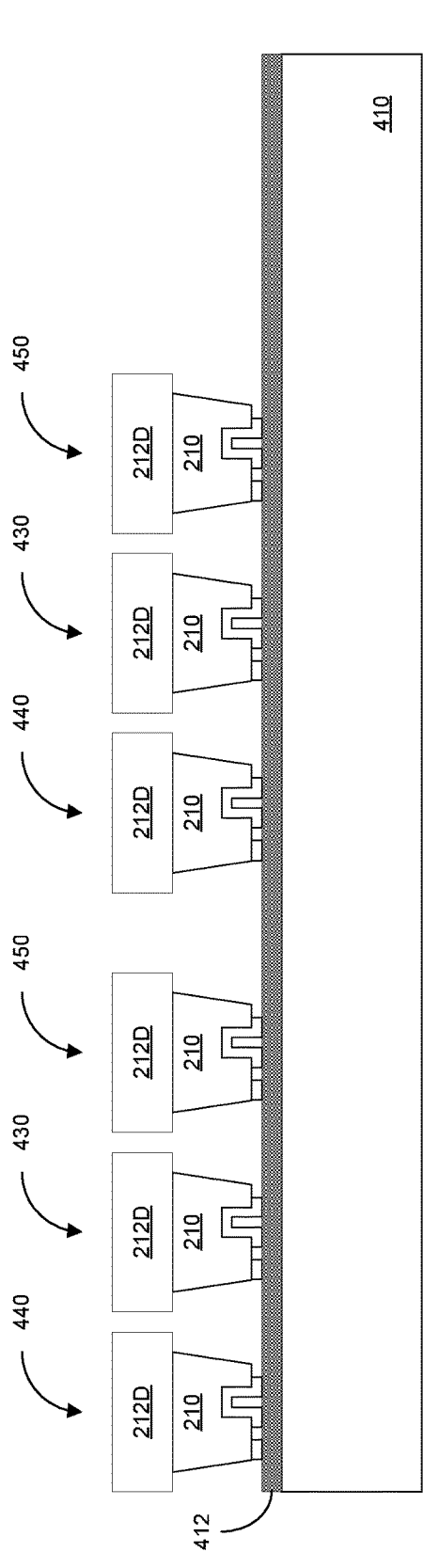
FIG. 4C illustrates an example third stage of mass transfer of singulated microLED devices to a target substrate, further to the example second stage of FIG. 4B.

FIG. 4C illustrates an example third stage of mass transfer of singulated microLED devices to a target substrate, further to the example second stage of FIG. 4B. As illustrated by way of example in FIG. 4C, an example third stage includes the first handler substrate 410, the first handler substrate adhesive layer 412, the microLEDs 210 and their corresponding singulated photoemitting layers 212D. The microLEDs and their corresponding singulated photoemitting layers 212D can be placed in accordance with a wavelength of light each microLED is operable to emit. As one example, the microLEDs 210 and the corresponding singulated photoemitting layers 212D can be placed in a microLED array including green LEDs 430, red LEDs 440, and blur LEDs 450. It is to be understood that that the placement of microLEDs is not limited to the particular configuration illustrated herein. The microLEDs 430, 440, and 450 can each be placed in accordance with the stages of FIGS. 2A-4B as discussed above.

Figure 5A:
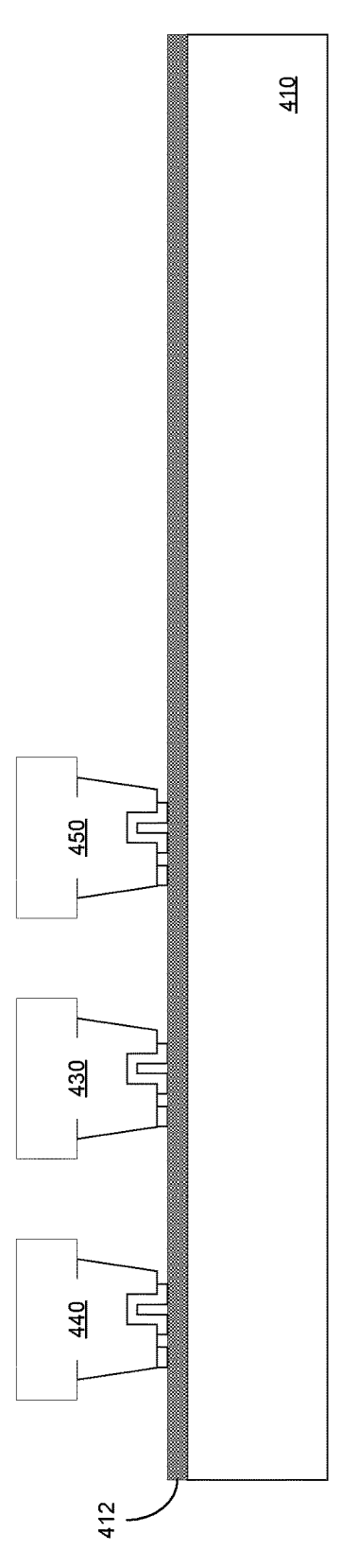
FIG. 5A illustrates an example first stage of manufacturing a flexible inorganic microLED display device, further to the example third stage of FIG. 4C.

FIG. 5A illustrates an example first stage of manufacturing a flexible inorganic microLED display device, further to the example third stage of FIG. 4C. As illustrated by way of example in FIG. 5A, an example first stage 500A includes the first handler substrate 410, the first handler substrate adhesive layer 412, and the microLEDs 430, 440 and 450. The microLEDs 430, 440 and 450 are in their final assembly position, and are ready to have various dies, interconnects and layers, including a flexible layer, integrated therewith.

Figure 5B:
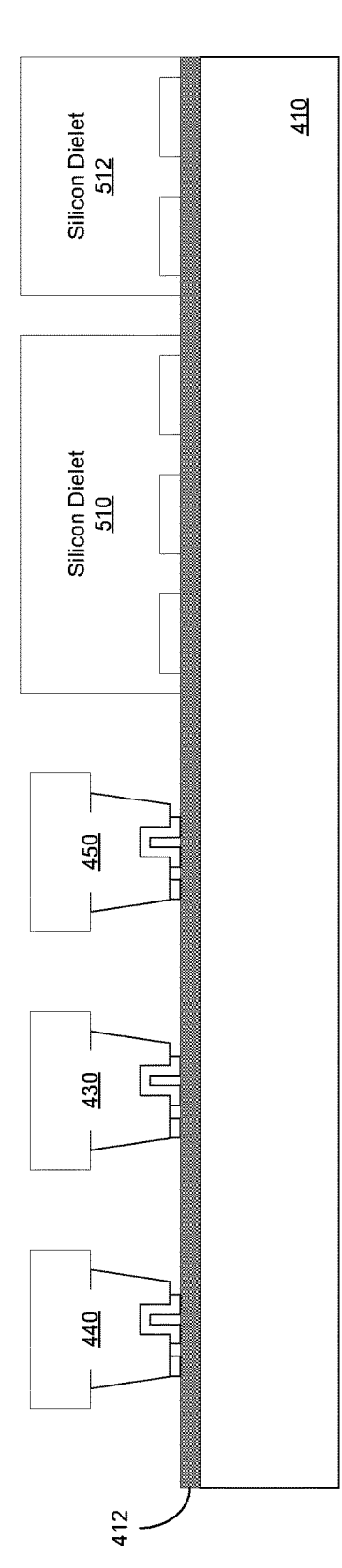
FIG. 5B illustrates an example second stage of manufacturing a flexible inorganic microLED display device, further to the example first stage of FIG. 5A.

FIG. 5B illustrates an example second stage of manufacturing a flexible inorganic microLED display device, further to the example first stage of FIG. 5A. As illustrated by way of example in FIG. 5B, an example second stage includes the first handler substrate 410, the first handler substrate adhesive layer 412, the microLEDs 430, 440 and 450, and silicon dielets 510 and 512. The silicon dielets 510 and 512 are placed on the first handler substrate 410 in contact with the first handler substrate adhesive layer 412 into their final assembly position. The silicon dielets 510 and 512 can correspond in one or more of size, structure operation, and composition to the silicon dies 120.

Figure 5C:
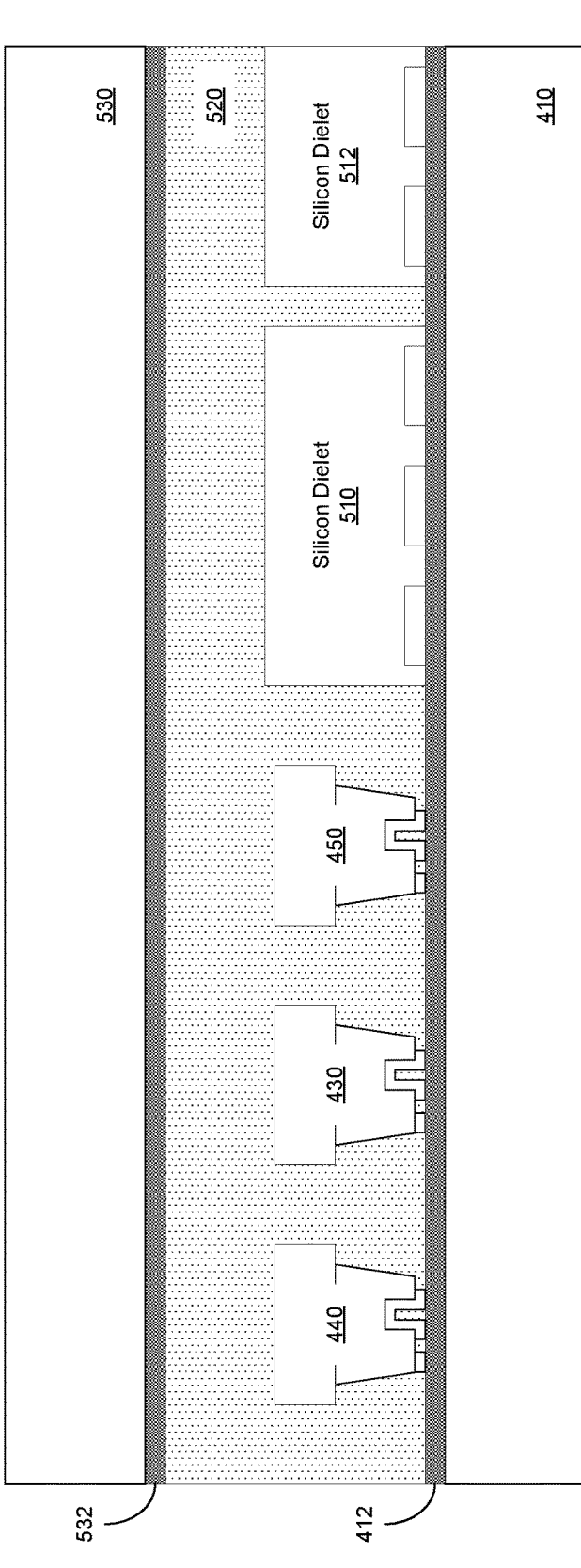
FIG. 5C illustrates an example third stage of manufacturing a flexible inorganic microLED display device, further to the example second stage of FIG. 5B.

FIG. 5C illustrates an example third stage of manufacturing a flexible inorganic microLED display device, further to the example second stage of FIG. 5B. As illustrated by way of example in FIG. 5C, an example third stage 500C includes the first handler substrate 410, the first handler substrate adhesive layer 412, the microLEDs 430, 440 and 450, the silicon dielets 510 and 512, a flexible layer 520, a second handler substrate 530, and a second handler substrate adhesive layer 532. The flexible layer 520 is deposited over the microLEDs 430, 440 and 450, and the silicon dielets 510 and 520. A rubber or like edging can be placed around the first handler substrate 410 to contain the liquid form of the flexible layer 520, and can be removed subsequent to solidification of the flexible layer 520. The second handler substrate 530 can enclose the flexible layer 520 during a compression molding process resulting in solidification of the flexible layer 520.

Figure 5D:
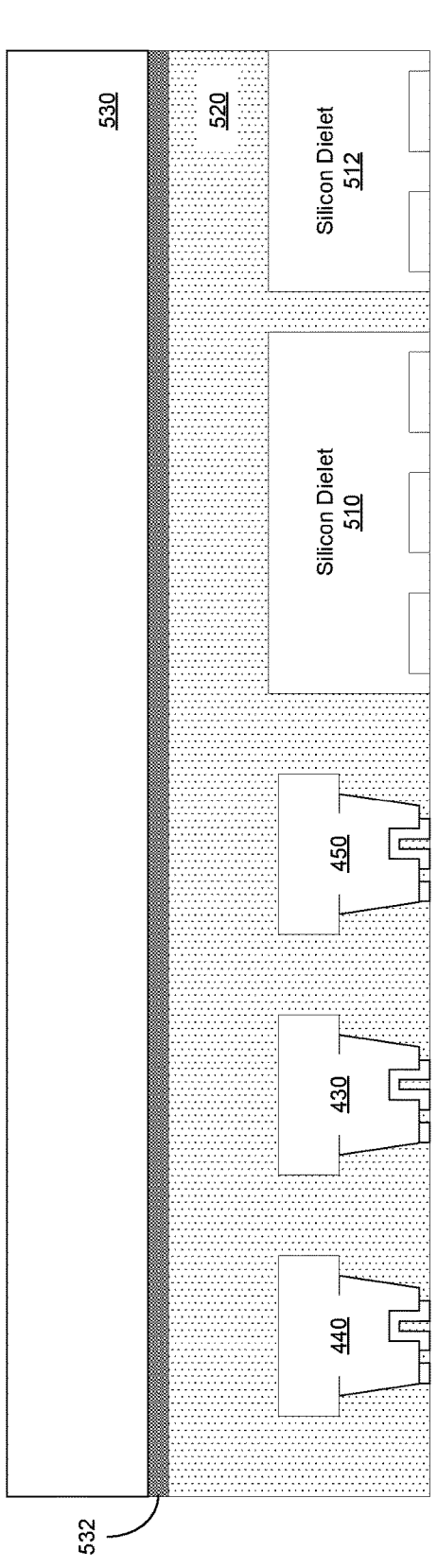
FIG. 5D illustrates an example fourth stage of manufacturing a flexible inorganic microLED display device, further to the example third stage of FIG. 5C.

FIG. 5D illustrates an example fourth stage of manufacturing a flexible inorganic microLED display device, further to the example third stage of FIG. 5C. As illustrated by way of example in FIG. 5D, an example fourth stage 500D includes the microLEDs 430, 440 and 450, the silicon dielets 510 and 512, the flexible layer 520, the second handler substrate 530, and the second handler substrate adhesive layer 532. The first handler substrate 410 and the first handler substrate adhesive layer 412 are removed from the microLEDs 430, 440 and 450, the silicon dielets 510 and 512, and the flexible layer 520.

Figure 6A:
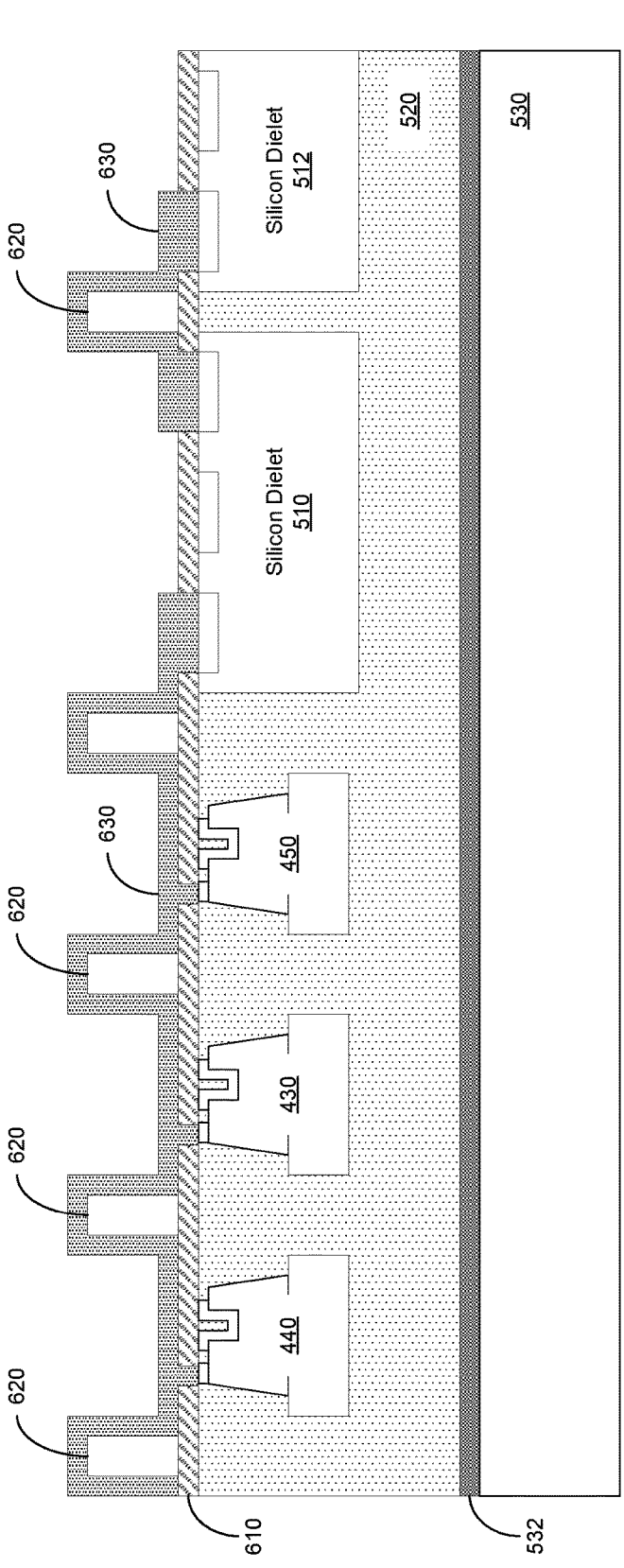
FIG. 6A illustrates an example first stage of manufacturing interconnect layers of a flexible inorganic microLED display device, further to the example fourth stage of FIG. 5D.

FIG. 6A illustrates an example first stage of manufacturing interconnect layers of a flexible inorganic microLED display device, further to the example fourth stage of FIG. 5D. As illustrated by way of example in FIG. 6A, an example first stage 600A includes the microLEDs 430, 440 and 450, the silicon dielets 510 and 512, the flexible layer 520, the second handler substrate 530, the second handler substrate adhesive layer 532, an optical stress buffer layer 610, corrugated layers 620, and a first interconnect layer 630. The second handler substrate 530 and the elements thereon can be inverted by a flip chip process, resulting in the second handler substrate 530 being at a bottom of a partially complete flexible display device assembly. Electrical, electronic, and like objects, interconnects, layers, vias, and the like can be added to the partially complete assembly at a face thereof opposite to the second handler substrate 530. The optical stress buffer layer 610 is disposed on the flexible layer 520 at a face including the electrical contacts of the microLEDs 430, 440 and 450, and the silicon dielets 510 and 512. The optical stress buffer layer 610 can cover, enclose, or the like, all of the exposed surface of the flexible layer 520, the microLEDs 430, 440 and 450, and the silicon dielets 510 and 512 on at least the face of the partially completed assembly opposite to the second handler substrate 530. The corrugated layers 620 are disposed on the optical stress buffer layer 610 and are disposed between the microLEDs 430, 440 and 450, and the silicon dielets 510 and 512. The first interconnect layer 630 is disposed on the optical stress buffer layer 610 and can also be disposed on or over one or more of the corrugated layers 620. The first interconnect layer 630 can include one or more electrically isolated portions operatively coupling various ones or pluralities of the microLEDs 430, 440 and 450, and the silicon dielets 510 and 512. As one example, a first portion of the first interconnect layer 630 can operatively couple a plurality of the microLEDs 430, 440 and 450, to the silicon dielet 510 at a first electrical terminal, electrode pad, or the like, thereof. As another example, a second portion of the first interconnect layer 630 can operatively couple the silicon dielet 510 to the silicon dielet 512 at a second electrical terminal, electrode pad, or the like, of the silicon dielet 510 and a first electrical terminal, electrode pad, or the like, of the silicon dielet 512.

Figure 6B:
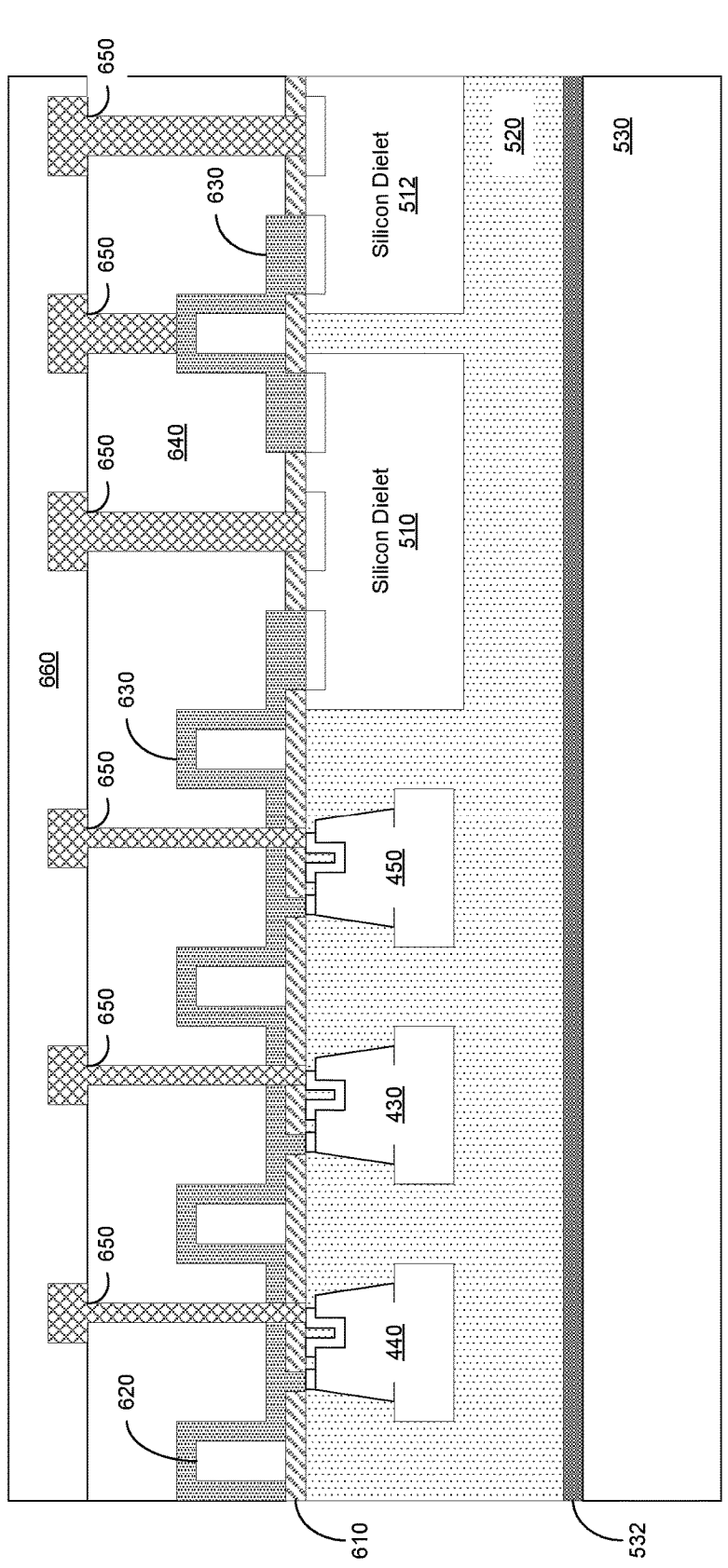
FIG. 6B illustrates an example second stage of manufacturing interconnect layers of a flexible inorganic microLED display device, further to the example first stage of FIG. 6A.

FIG. 6B illustrates an example second stage of manufacturing interconnect layers of a flexible inorganic microLED display device, further to the example first stage of FIG. 6A. As illustrated by way of example in FIG. 6B, an example second stage 600B includes the microLEDs 430, 440 and 450, the silicon dielets 510 and 512, the flexible layer 520, the second handler substrate 530, the second handler substrate adhesive layer 532, the optical stress buffer layer 610, corrugated layers 620, the first interconnect layer 630 a dielectric layer 640, a second interconnect layer 650, and a passivation layer 660. The dielectric layer is disposed on the first interconnect layer 620, and can cover, enclose, or the like, all of the exposed surface of the first interconnect layer 630 and the optical stress buffer layer 620 on at least the face of the partially completed assembly opposite to the second handler substrate 530. The dielectric layer 640 can also include various holes, via, gaps, and the like to also electrical interconnect or the like to be formed through portions of the dielectric layer 640. The second interconnect layer 650 is disposed in contact with one or more of the microLEDs 430, 440 and 450, the silicon dielets 510 and 512 at electrode pads or the like thereof. The second interconnect layer 650 can include one or more electrically isolated portions operatively coupling various ones or pluralities of the microLEDs 430, 440 and 450, and the silicon dielets 510 and 512. The passivation layer 660 is disposed on the dielectric layer 640 and the second interconnect layer 650, and can provide a protective and electrically coupling coating of the components underneath.

Figure 6C:
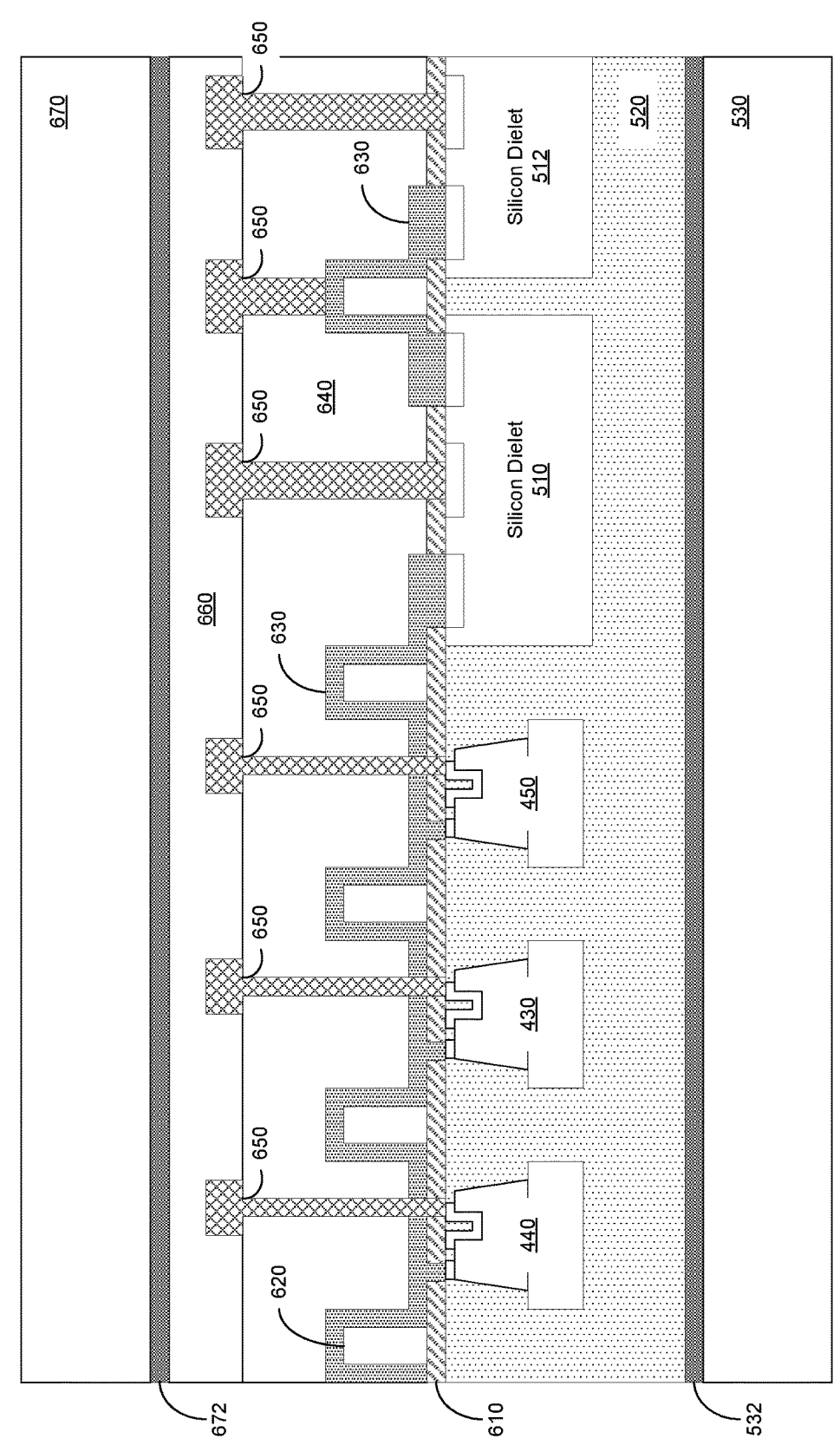
FIG. 6C illustrates an example third stage of manufacturing interconnect layers of a flexible inorganic microLED display device, further to the example second stage of FIG. 6B.

FIG. 6C illustrates an example third stage of manufacturing interconnect layers of a flexible inorganic microLED display device, further to the example second stage of FIG. 6B. As illustrated by way of example in FIG. 6C, an example third stage 600C includes the microLEDs 430, 440 and 450, the silicon dielets 510 and 512, the flexible layer 520, the second handler substrate 530, the second handler substrate adhesive layer 532, the optical stress buffer layer 610, corrugated layers 620, the first interconnect layer 630 a dielectric layer 640, a second interconnect layer 650, a passivation layer 660, a third handler substrate 670, and a third handler substrate adhesive layer 672. The third handler substrate adhesive layer 672 can be placed in contact with the passivation layer 660 by the third handler substrate 670.

Figure 6D:
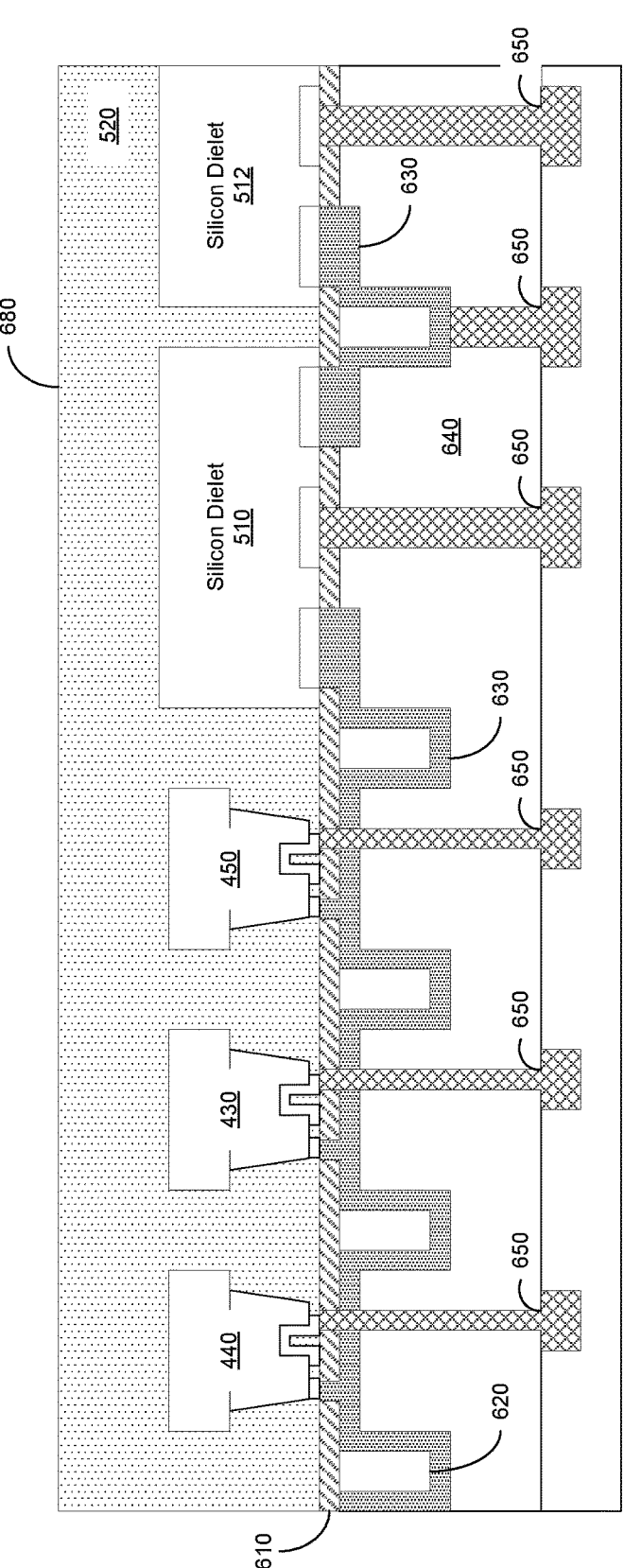
FIG. 6D illustrates an example fourth stage of manufacturing interconnect layers of a flexible inorganic microLED display device, further to the example third stage of FIG. 6C.

FIG. 6D illustrates an example fourth stage of manufacturing interconnect layers of a flexible inorganic microLED display device, further to the example third stage of FIG. 6C. As illustrated by way of example in FIG. 6D, an example fourth stage 600D includes the microLEDs 430, 440 and 450, the silicon dielets 510 and 512, the flexible layer 520, optical stress buffer layer 610, corrugated layers 620, the first interconnect layer 630 a dielectric layer 640, the second interconnect layer 650, the passivation layer 660, and a planarized flexible device surface 670. The second handler substrate 530 is removed, and the third handler substrate 670 can be oriented at a top of the completed assembly before flipping. The third handler substrate 670 and the elements thereon can be inverted by a flip chip process, resulting in the third handler substrate 670 being at a bottom of a complete flexible display device assembly. After the flip-chip process, the surface of the flexible layer can be polished to a planarized flexible device surface 670.

Figure 7:
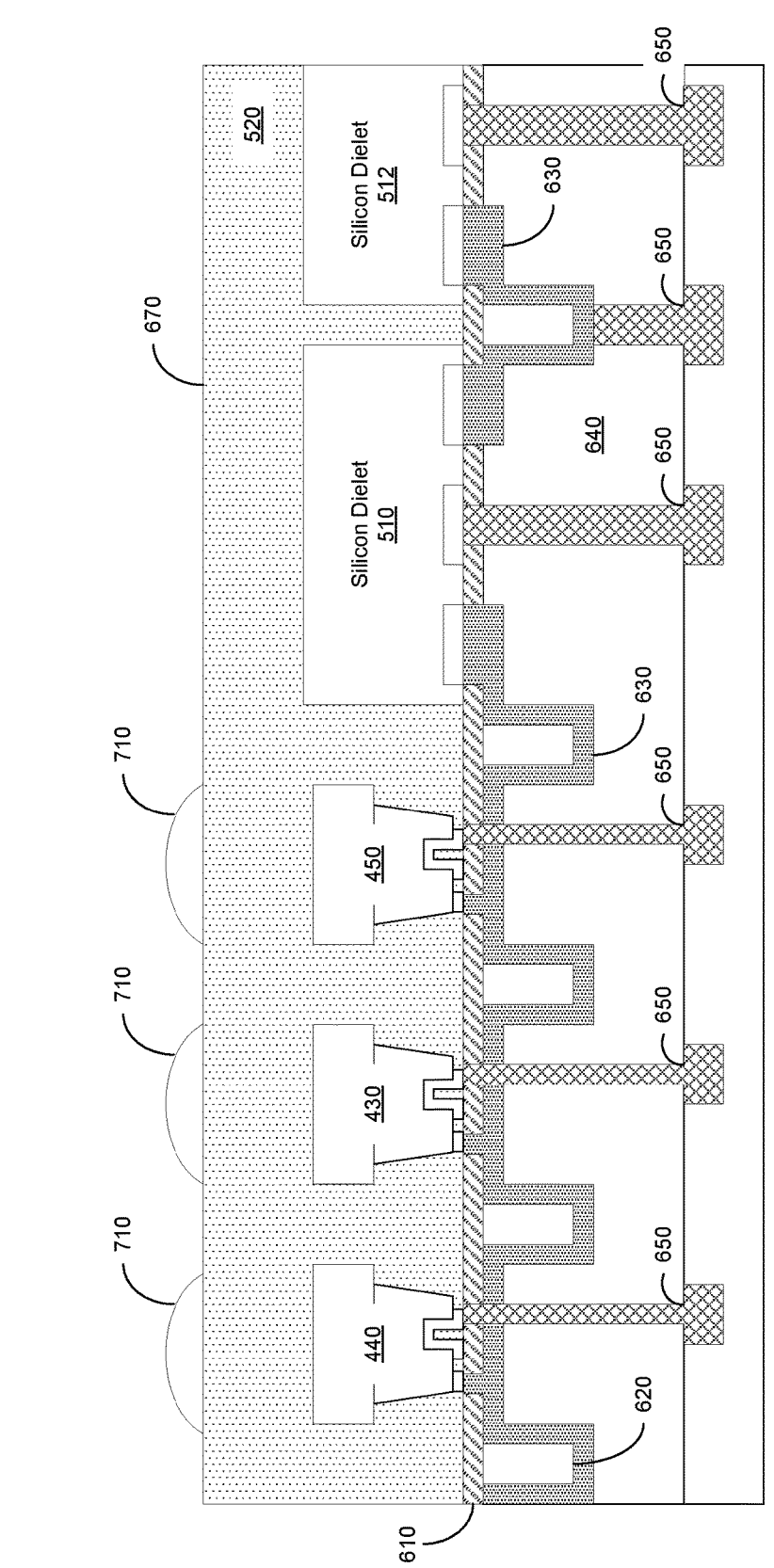
FIG. 7 illustrates an example stage of lenses of a flexible inorganic microLED display device, further to the example fourth stage of FIG. 6D.

FIG. 7 illustrates an example stage of lenses of a flexible inorganic microLED display device, further to the example fourth stage of FIG. 6D. As illustrated by way of example in FIG. 7, an example stage 700 includes the microLEDs 430, 440 and 450, the silicon dielets 510 and 512, the flexible layer 520, optical stress buffer layer 610, corrugated layers 620, the first interconnect layer 630 a dielectric layer 640, the second interconnect layer 650, the passivation layer 660, and a plurality of polymeric lenses 710. The polymeric lenses 710 are disposed on a corresponding one of the microLEDs 430, 440 and 450, and can focus the light emitted from respective ones of the microLEDs 430, 440 and 450 into parallelized rays. It is to be understood that the example stage 700 can include one or more polymeric lenses 710.

Figure 8:
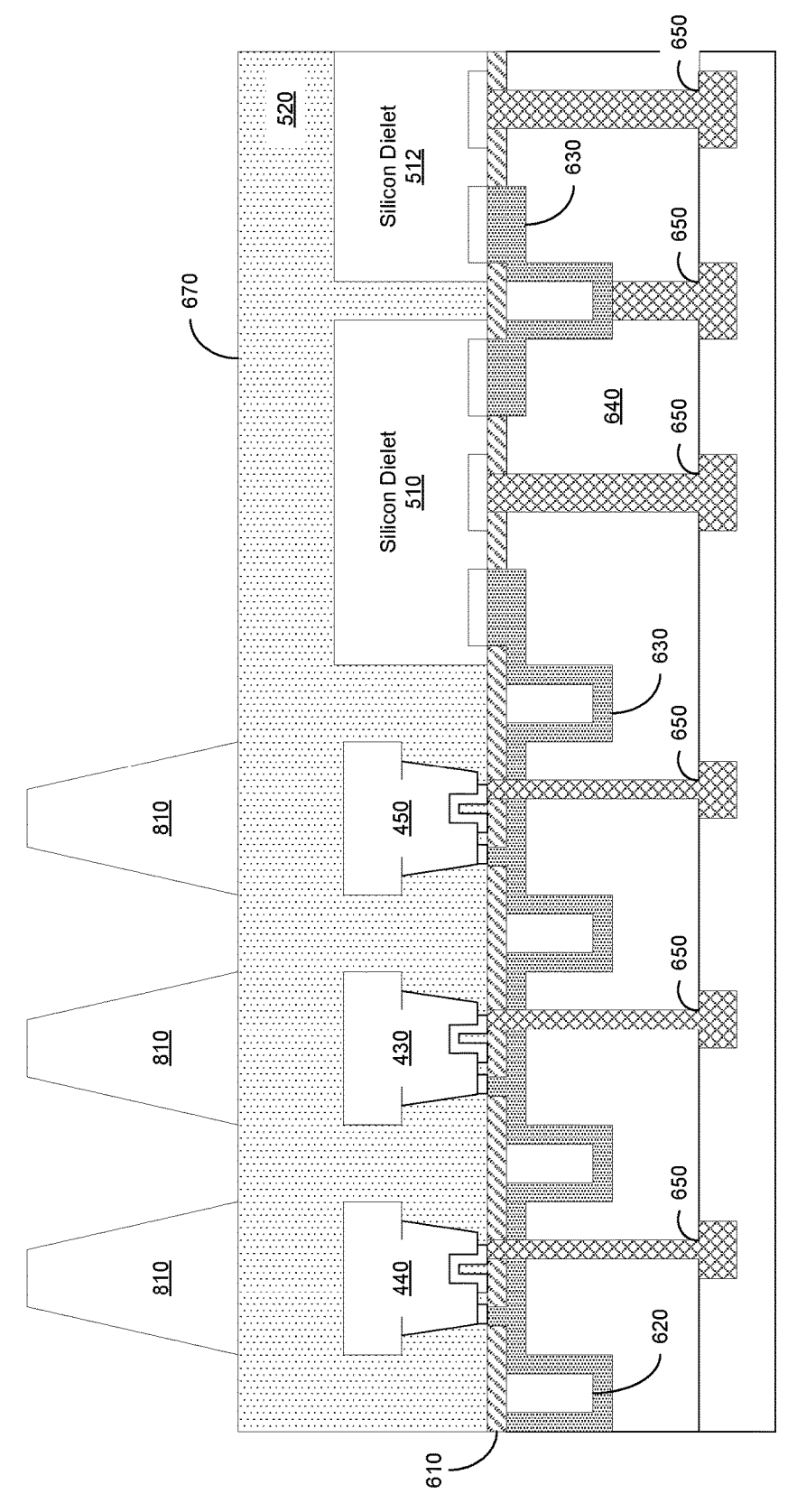
FIG. 8 illustrates an example stage of manufacturing waveguides of a flexible inorganic microLED display device, further to the example fourth stage of FIG. 6D.

FIG. 8 illustrates an example stage of manufacturing waveguides of a flexible inorganic microLED display device, further to the example fourth stage of FIG. 6D. As illustrated by way of example in FIG. 7, an example stage 800 includes the microLEDs 430, 440 and 450, the silicon dielets 510 and 512, the flexible layer 520, optical stress buffer layer 610, corrugated layers 620, the first interconnect layer 630 a dielectric layer 640, the second interconnect layer 650, the passivation layer 660, and a plurality of waveguides 810. The waveguides 810 are disposed on a corresponding one of the microLEDs 430, 440 and 450, and can focus the light emitted from respective ones of the microLEDs 430, 440 and 450 into rays converging to a predetermined focal point. It is to be understood that the example stage 700 can include one or more waveguides 810.

Figure 9:
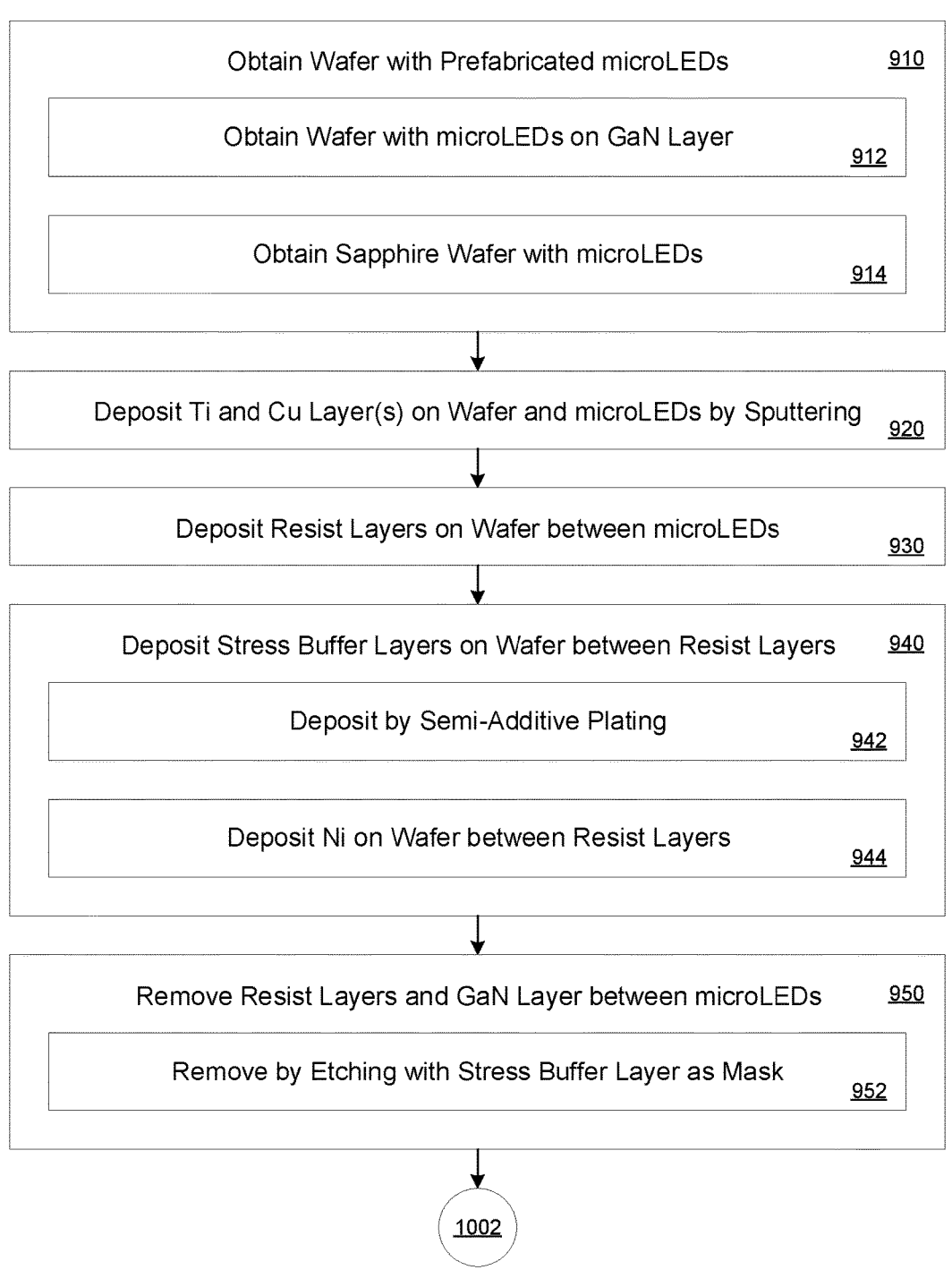
FIG. 9 illustrates an example method of singulating a plurality of flexible inorganic microLED devices, in accordance with present implementations.

FIG. 9 illustrates an example method of singulating a plurality of flexible inorganic microLED devices, in accordance with present implementations. In some implementations, the example device 100 is at least partially manufactured by method 900 according to present implementations. In some implementations, the method 900 begins at step 910.

At step 910, the example system obtains at least one wafer including one or more prefabricated display devices. The display device can be microLEDs having the same display characteristics. As one example, a display characteristic can be a color, range of colors, or the like emitted by a microLED. The wafer can include a plurality of microLEDs mass-fabricated thereon. In some implementations, step 910 includes at least one of steps 912 and 914. At step 912, the example system obtains a wafer with one or more microLEDs fabricated on a gallium nitride (GaN) layer disposed on the wafer. At step 914, the example system obtains a wafer including sapphire and having the microLEDs disposed thereon. The sapphire wafer can possess an advantageous transparency property for allowing the microLEDs to be separated from the wafer by irradiation. The method 900 then continues to step 920.

At step 920, the example system deposits titanium (Ti) and copper (Cu) layers on the wafer and the microLEDs by a sputtering process. In some implementations, the example system deposits the titanium and copper layers sequentially, by depositing the titanium layer on the wafer and the microLEDs, and depositing the copper layer on the titanium layer. As one example, the titanium layer can be 30 nm thick. As another example, the copper layer can be 250 nm thick. The method 900 then continues to step 930.

At step 930, the example system deposits one or more resist layers on the wafer between one or more of the microLEDs. The resist layers can be formed by a multiple step fabrication process or a single-step fabrication process to form posts, walls, or the like over and around one or more of the microLEDs. As one example, the resist layers can be 10 μm thick. The method 900 then continues to step 940.

At step 940, the example system deposits one or more stress buffer layers on the wafer between resist layers. The resist layers can advantageously protect the microLEDs and their electrical contacts, electrode pads, and the like, during a mass transfer process. In some implementations, step 940 includes at least one of steps 942 and 944. At step 942, the example system deposits the stress buffer layers by semi-additive plating. At step 944, the example system deposits nickel (Ni) on the wafer between the resist layers. The method 900 then continues to step 950.

At step 950, the example system removes one or more of the resist layers and GaN layer between the microLEDS. The removing can advantageously form a channel or the like between microLEDs to improve singulation of the wafer into microLED dies. In some implementations, step 950 includes step 952. At step 952, the example system removes the resist layers and the GaN layer by etching. The stress buffer layer can advantageously serve as a mask for the etching process. Nickel can advantageously resist breakdown during etching. The method 900 then continues to step 1002.

Figure 10:
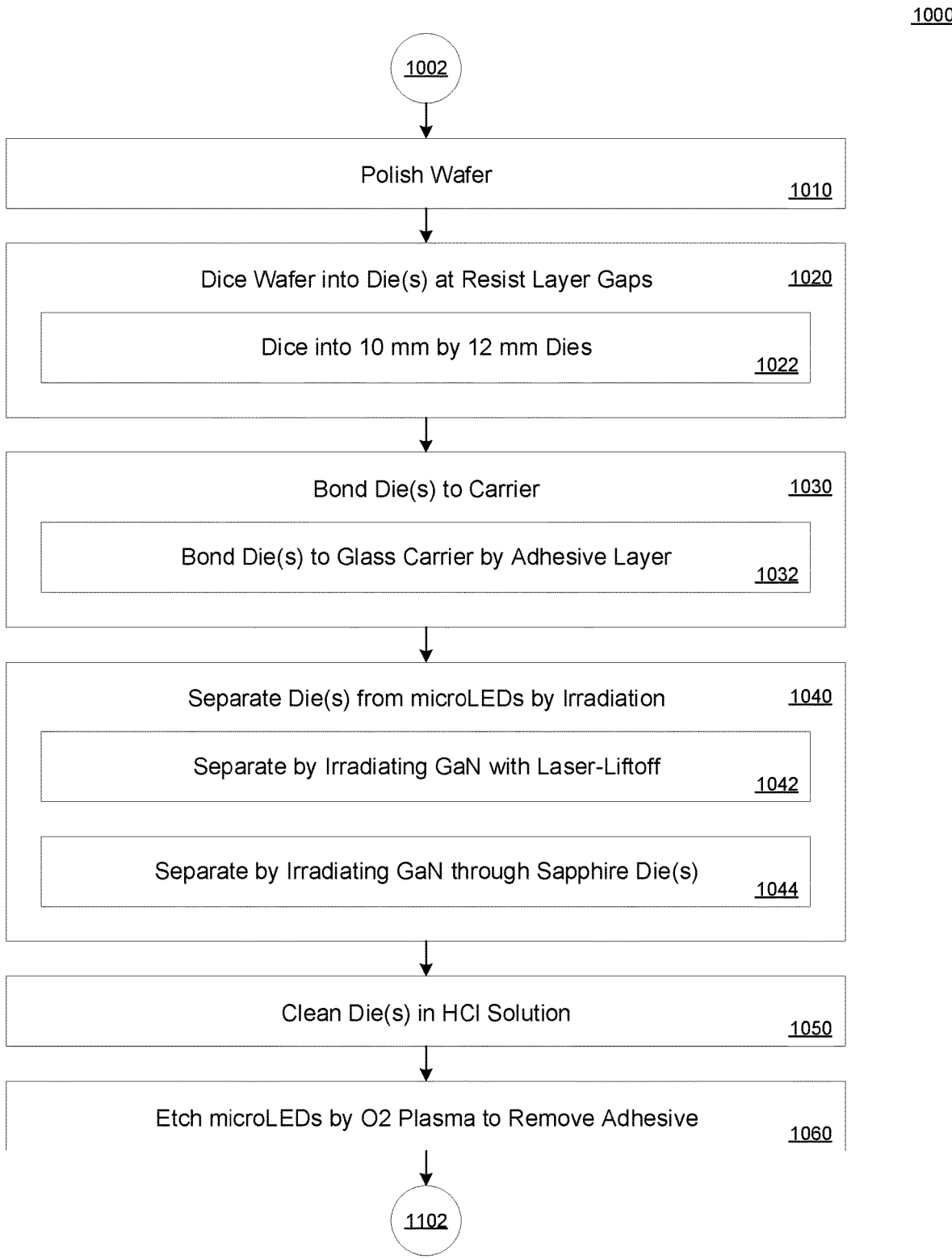
FIG. 10 illustrates an example method of mass transfer of singulated microLED devices, further to the example method of FIG. 9.

FIG. 10 illustrates an example method of mass transfer of singulated microLED devices, further to the example method of FIG. 9. In some implementations, the example device 100 is at least partially manufactured by method 1000 according to present implementations. In some implementations, the method 1000 begins at step 1002. The method 1000 then continues to step 1010.

At step 1010, the example system polishes the wafer. The wafer can be polished on a back side to an RMS roughness of substantially 1 nm. The wafer can be polished by a chemical mechanical processing process. The method 1000 then continues to step 1020. At step 1020, the example system dices the wafer into one or more dies at gaps formed by the removal. In some implementations, step 1020 includes step 1022. At step 1022, the example system dices the wafer into dies of approximately 10 mm by 12 mm. The method 1000 then continues to step 1030. At step 1030, the example system bonds the dies to a carrier. The carrier can be a 20 mm by 24 mm glass carrier. In some implementations, step 1030 includes step 1032. At step 1032, the example system bonds the dies to a glass carrier by an adhesive layer. The adhesive layer can be 2 μm thick. The method 1000 then continues to step 1040.

At step 1040, the example system separates the dies from the microLEDs by irradiation. At step 1042, the example system separates the dies from the microLEDs by a laser lift-off process. At step 1044, the example system separates the dies from the microLEDs by irradiating the GaN layer through the sapphire wafer. The method 1000 then continues to step 1050. At step 1050, the example system cleans dies in an acidic solution. The acidic solution can be hydrochloric acid (HCl). The method 1000 then continues to step 1060. At step 1060, the example system etches microLEDs by O2 plasma to remove adhesive. The O2 plasma treatment can remove any remaining adhesive attached to the microLEDs after separation from the dies. The method 1000 then continues to step 1102.

FIG. 11 illustrates an example method of manufacturing a flexible inorganic microLED display device, further to the example method of FIG. 10. In some implementations, the example device 100 is at least partially manufactured by method 1100 according to present implementations. In some implementations, the method 1100 begins at step 1102. The method 1100 then continues to step 1110.

At step 1110, the example system bonds the microLEDs to a glass stamp. In some implementations, step 1110 includes at least one of steps 1112 and 1114. At step 1112, the example system bonds an adhesive layer of the glass stamp to a GaN layer of a microLED. At step 1114, the example system bonds a subsets of microLEDs to the glass stamp. The glass stamp can bond to a subset of microLEDs corresponding to a single color among RGB microLEDs. The selective attachment can advantageously allow mass transfer of microLEDs to manufacture a full-color flexible microLED display. The method 1100 then continues to step 1120. At step 1120, the example system separates the microLEDs from the carrier by laser debonding. The method 1100 then continues to step 1130. At step 1130, the example system removes the stress buffer layers from the microLEDs. In some implementations, step 1130 includes step 1132. At step 1132, the example system removes the stress buffer layer by wet-etching the nickel of the stress buffer layer from the microLEDs. The method 1100 then continues to step 1140.

At step 1140, the example system bonds microLEDs to a first handler substrate. In some implementations, step 1140 includes step 1142. At step 1142, the example system bonds microLEDs to a first handler substrate at an adhesive layer of the first handler substrate. The first handler substrate can be a substrate for final assembly of the flexible display device according to present implementations, and the microLEDs can be placed at the first handler substrate in their final positions for manufacturing the flexible display device. The method 1100 then continues to step 1150. At step 1150, the example system separates the microLEDs from the glass stamp by laser debonding. The method 1100 then continues to step 1202.

Figure 12:
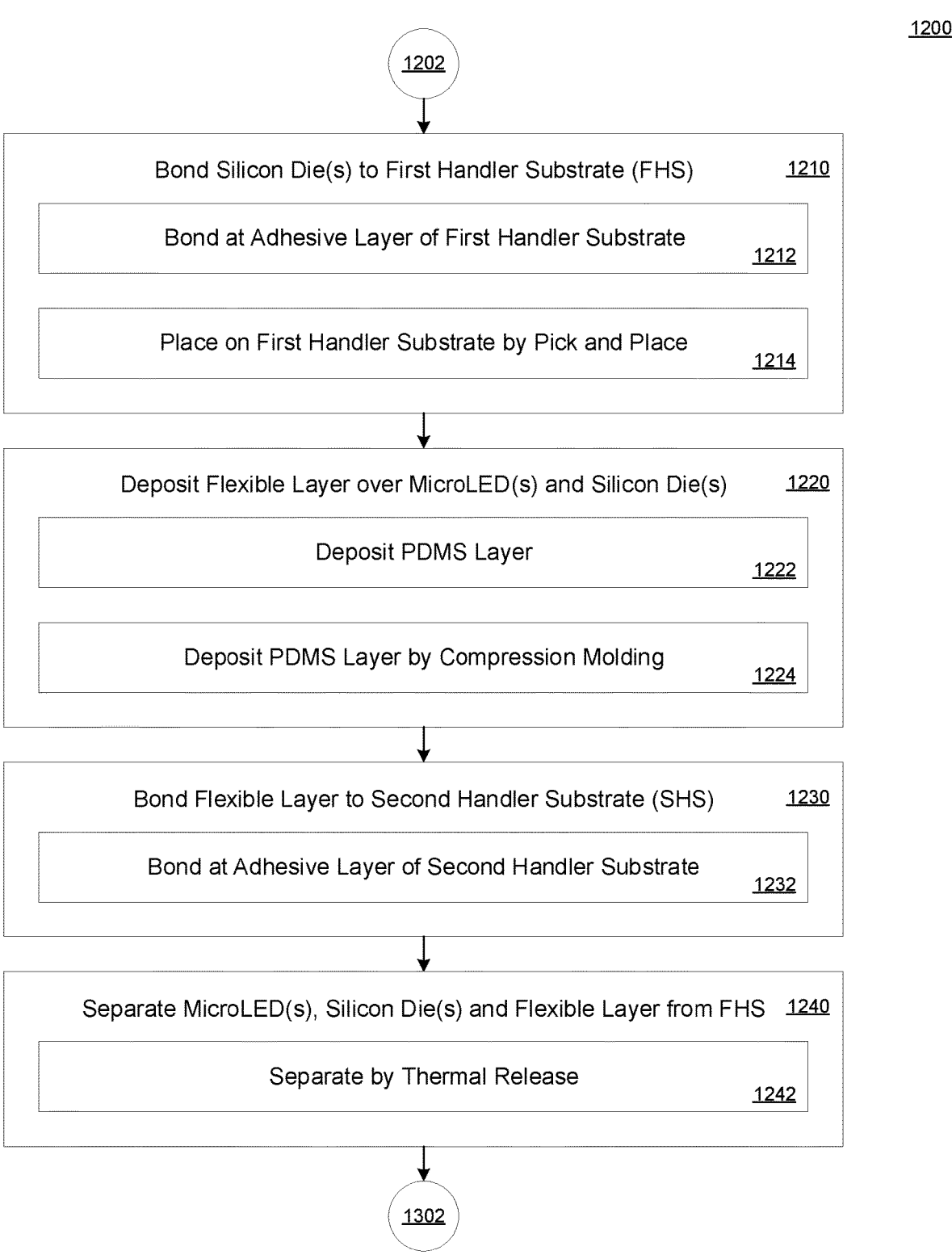
FIG. 12 illustrates an example method of manufacturing a flexible inorganic microLED display device, further to the example method of FIG. 11.

FIG. 12 illustrates an example method of manufacturing a flexible inorganic microLED display device, further to the example method of FIG. 11. In some implementations, the example device 100 is at least partially manufactured by method 1200 according to present implementations. In some implementations, the method 1200 begins at step 1202. The method 1200 then continues to step 1210.

At step 1210, the example system bonds one or more silicon dies to the first handler substrate. The silicon dies can be electronic devices for controlling the microLEDs, and can correspond to the silicon dies 130. In some implementations, step 1210 includes at least one of steps 1212 and 1214. At step 1212, the example system bonds the silicon dies at an adhesive layer of the first handler substrate. At step 1214, the example system places the silicon dies on the first handler substrate by a pick and place process. The method 1200 then continues to step 1220.

At step 1220, the example system deposits a flexible layer over the microLEDs and the silicon dies. The flexible layer can become a flexible sheet having embedded therein the microLEDs and the silicon dies. Thus, the flexible sheet can be a portion of a flexible display device. In some implementations, step 1220 includes at least one of steps 1222 and 1224. At step 1222, the example system deposits a layer including polydimethylsiloxane (PDMS). At step 1224, the example system deposits the PDMS layer by compression molding. The method 1200 then continues to step 1230.

At step 1230, the example system bonds the flexible layer to a second handler substrate. In some implementations, step 1230 includes step 1232. At step 1232, the example system bonds the flexible layer to the second handler substrate at an adhesive layer of the second handler substrate. The method 1200 then continues to step 1240. At step 1240, the example system separates the flexible sheet including the microLEDs, the silicon dies, and the flexible layer from the first handler substrate. In some implementations, step 1240 includes step 1242. At step 1242, the example system separates the flexible sheet from the first handler substrate by a thermal release process. The method 1200 then continues to step 1302.

Figure 13:
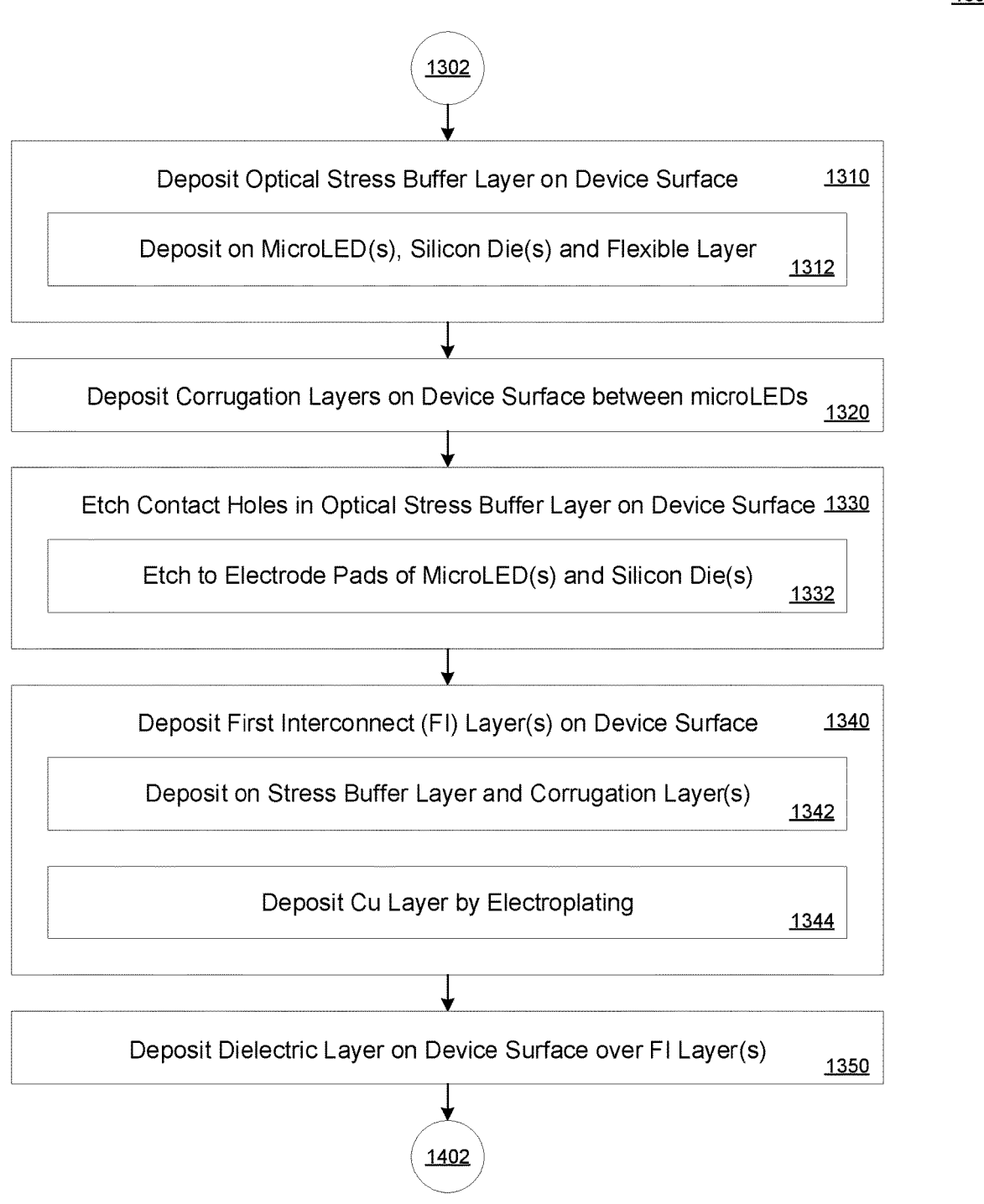
FIG. 13 illustrates an example method of manufacturing a flexible inorganic microLED display device, further to the example method of FIG. 12.

FIG. 13 illustrates an example method of manufacturing a flexible inorganic microLED display device, further to the example method of FIG. 12. In some implementations, the example device 100 is at least partially manufactured by method 1300 according to present implementations. In some implementations, the method 1300 begins at step 1302. The method 1300 then continues to step 1310.

At step 1310, the example system deposits an optical stress buffer layer on a surface of a flexible sheet having one or more surfaces of one or more of microLEDs and silicon dies exposed therethrough, adjacent thereto, proximate thereto, or the like. In some implementations, step 1310 includes step 1312. At step 1310, the example system deposits the optical stress buffer layer on one or more of the flexible sheet, the microLEDs and the silicon dies. The method 1300 then continues to step 1320.

At step 1320, the example system deposits one or more corrugation layers on the optical stress buffer layer between one or more of the microLEDs. The corrugation layers can be posts, walls, or the like at least partially surrounding one or more of the microLEDs. The corrugation layers can include SU-8. The method 1300 then continues to step 1130. At step 1330, the example system etches one or more contact holes in the optical stress buffer layer. In some implementations, step 1330 includes step 1332. At step 1332, the example system etch the contact holes to one or more electrode pads, electrical contacts, or the like, of one or more of the microLEDs and the silicon dies. The method 1300 then continues to step 1340.

At step 1340, the example system deposits a first inter-connect layer over one or more of the optical stress buffer layer, the corrugation layers, and the contact holes. The first interconnect can include traces operatively coupling one or more microLEDs and silicon dies. As one example, the first interconnect layer can include copper. In some implementations, step 1340 includes at least one of steps 1342 and 1344. At step 1342, the example system deposits the first interconnect layer on the stress buffer layer and the corrugation layers. At step 1344, the example system deposits copper of the first interconnect layer by electroplating. The method 1300 then continues to step 1350. At step 1350, the example system deposits a dielectric layer on the first interconnect layer and the optical stress buffer layer. The method 1300 then continues to step 1402.

Figure 14:
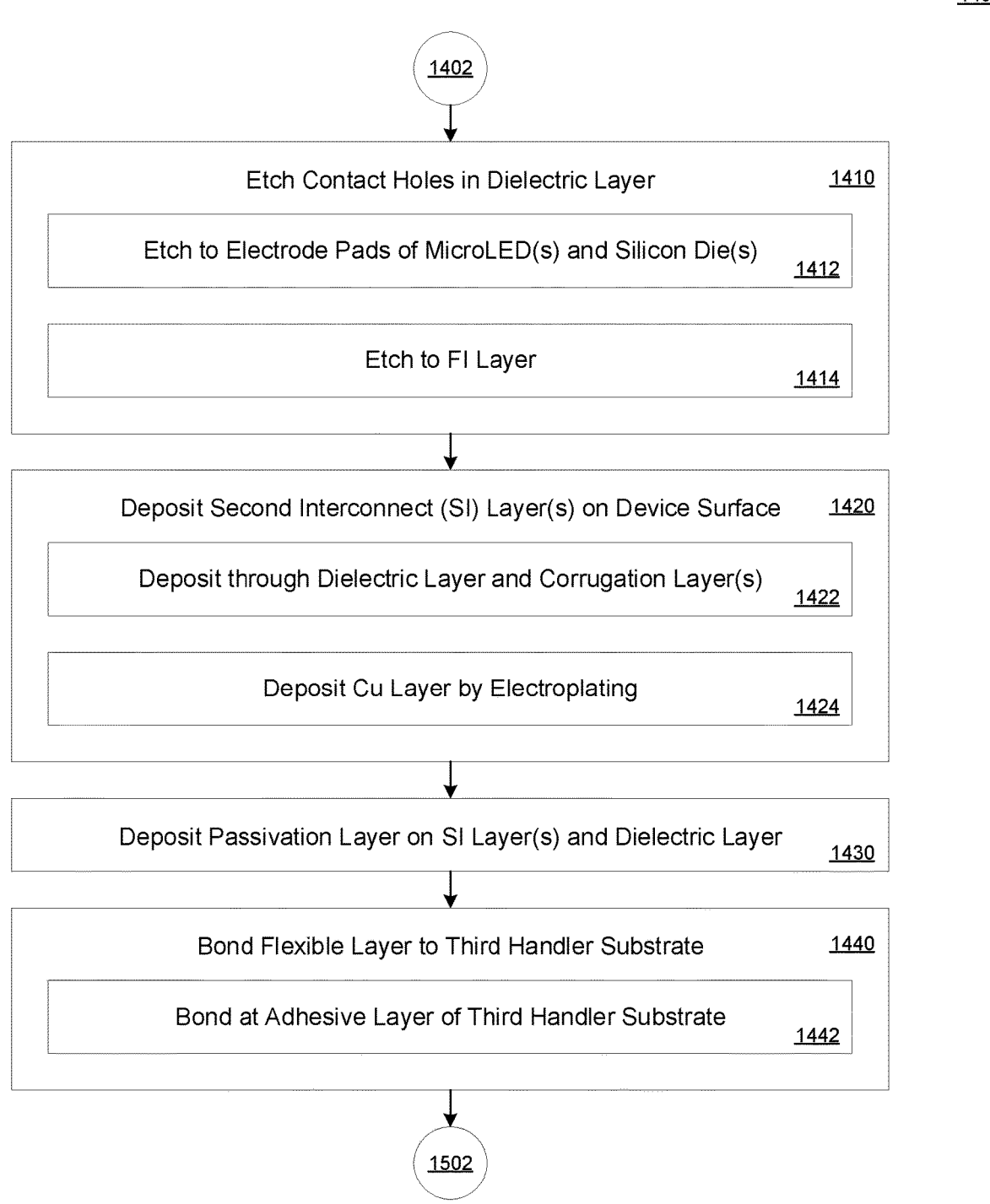
FIG. 14 illustrates an example method of manufacturing a flexible inorganic microLED display device, further to the example method of FIG. 13.

FIG. 14 illustrates an example method of manufacturing a flexible inorganic microLED display device, further to the example method of FIG. 13. In some implementations, the example device 100 is at least partially manufactured by method 1400 according to present implementations. In some implementations, the method 1400 begins at step 1402. The method 1400 then continues to step 1410.

At step 1410, the example system etches one or more contact holes in the dielectric layer. In some implementations, step 1410 includes at least one of steps 1412 and 1414. At step 1412, the example system etches one or more contact holes to electrical contact with one or more electrode pads, electrical contacts, or the like, of one or more of the microLEDs and the silicon dies. At step 1414, the example system etches one or more contact holes to the first inter-connect layer. The method 1400 then continues to step 1420.

At step 1420, the example system deposits a second interconnect layer on the dielectric layer. The second inter-connect layer can be one or more vias, posts, or the like for operatively coupling one or more of the microLEDs and the silicon dies to external electrical connections or the like. As one example, the second interconnect layer can be copper. In some implementations, step 1420 includes at least one of steps 1422 and 1424. At step 1422, the example system deposits the second interconnect layer through one or more of the dielectric layer and the corrugation layers. At step 1424, the example system deposits a copper layer by elec-troplating. The method 1400 then continues to step 1430. At step 1430, the example system deposits a passivation layer on the second interconnect layer and the dielectric layer. The method 1400 then continues to step 1440. At step 1440, the example system bonds the flexible layer of the flexible sheet to a third handler substrate. In some implementations, step 1440 includes step 1442. At step 1442, the example system bonds the flexible layer of the flexible sheet to an adhesive layer of the third handler substrate. The method 1400 then continues to step 1502.

Figure 15:
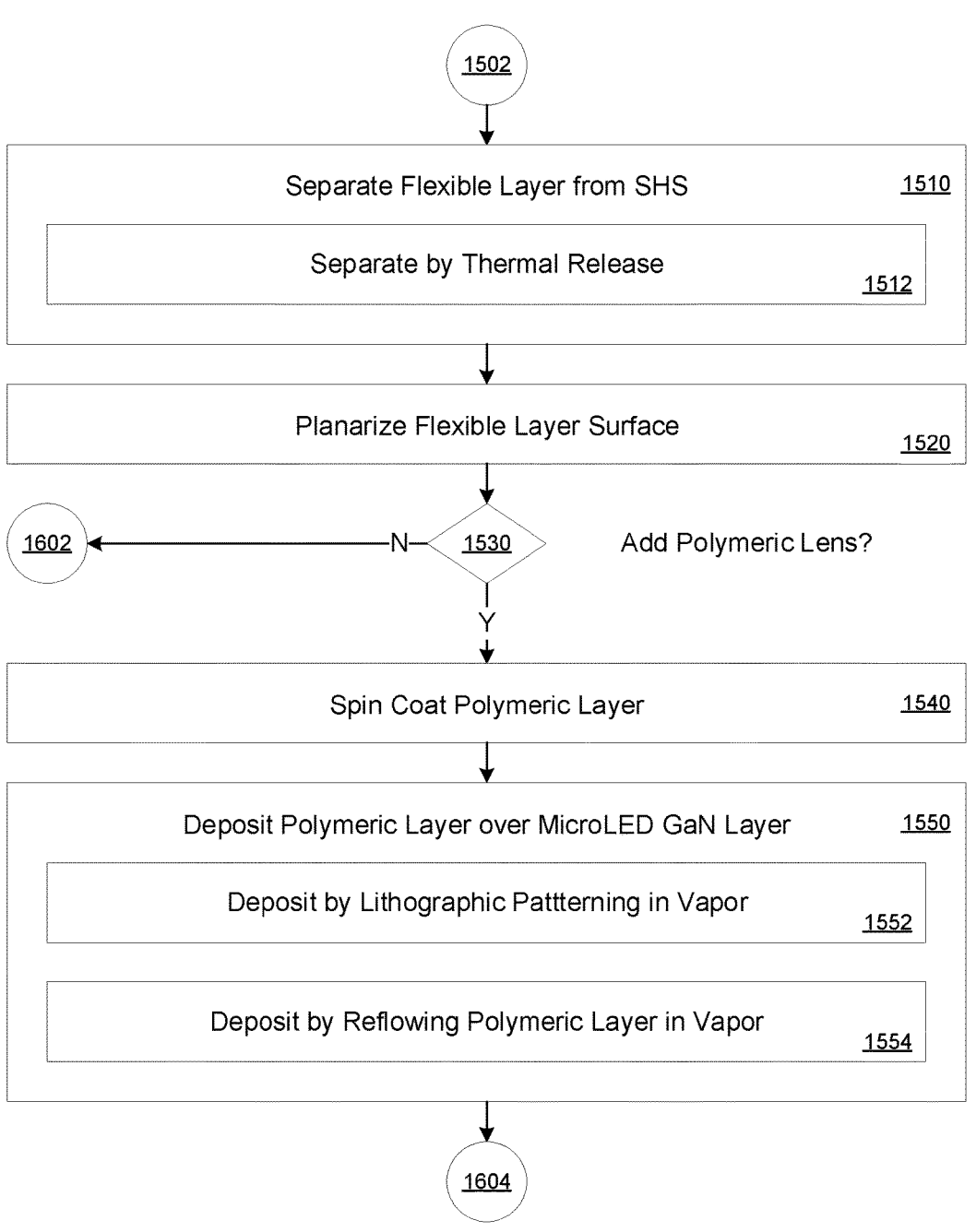
FIG. 15 illustrates an example method of manufacturing a flexible inorganic microLED display device, further to the example method of FIG. 14.

FIG. 15 illustrates an example method of manufacturing a flexible inorganic microLED display device, further to the example method of FIG. 14. In some implementations, the example device 100 is at least partially manufactured by method 1500 according to present implementations. In some implementations, the method 1500 begins at step 1502. The method 1500 then continues to step 1510.

At step 1510, the example system separates the flexible layer from the second handler substrate. In some implemen-tations, step 1510 includes step 1512. At step 1512, the example system separates the flexible layer from the second handler substrate by a thermal release process. The method 1500 then continues to step 1520.

At step 1520, the example system planarizes the surface of the flexible layer. The surface of the flexible layer can be planarized by application of an additional amount of flexible material in a spin coating process. Planarization can advan-tageously reduce scattering of light emitted from the microLEDs. The method 1500 then continues to step 1520.

At step 1530, the example system determines whether to add a polymeric lens to the planarized surface of the flexible layer. In accordance with a determination to add a polymeric lens to the planarized surface of the flexible layer, the method 1500 continues to step 1540. Alternatively, in accordance with a determination not to add a polymeric lens to the planarized surface of the flexible layer, the method 1500 continues to step 1602.

At step 1540, the example system spin coats a polymeric layer. The polymeric layer can be SU-8. The polymeric layer can be 10 μm thick. The method 1500 then continues to step 1550. At step 1550, the example system deposits a polymeric layer over the microLED GaN layer. The spin coating can be followed by lithographic patterning and SU-8 reflow in cyclopentanone vapor. In some implementations, step 1550 includes at least one of steps 1552 and 1554. At step 1552, the example system deposits the polymeric layer by lithographic patterning in vapor. At step 1554, the example system deposits a polymeric layer by reflowing the polymeric layer in vapor. The method 1500 then continues to step 1604.

Figure 16:
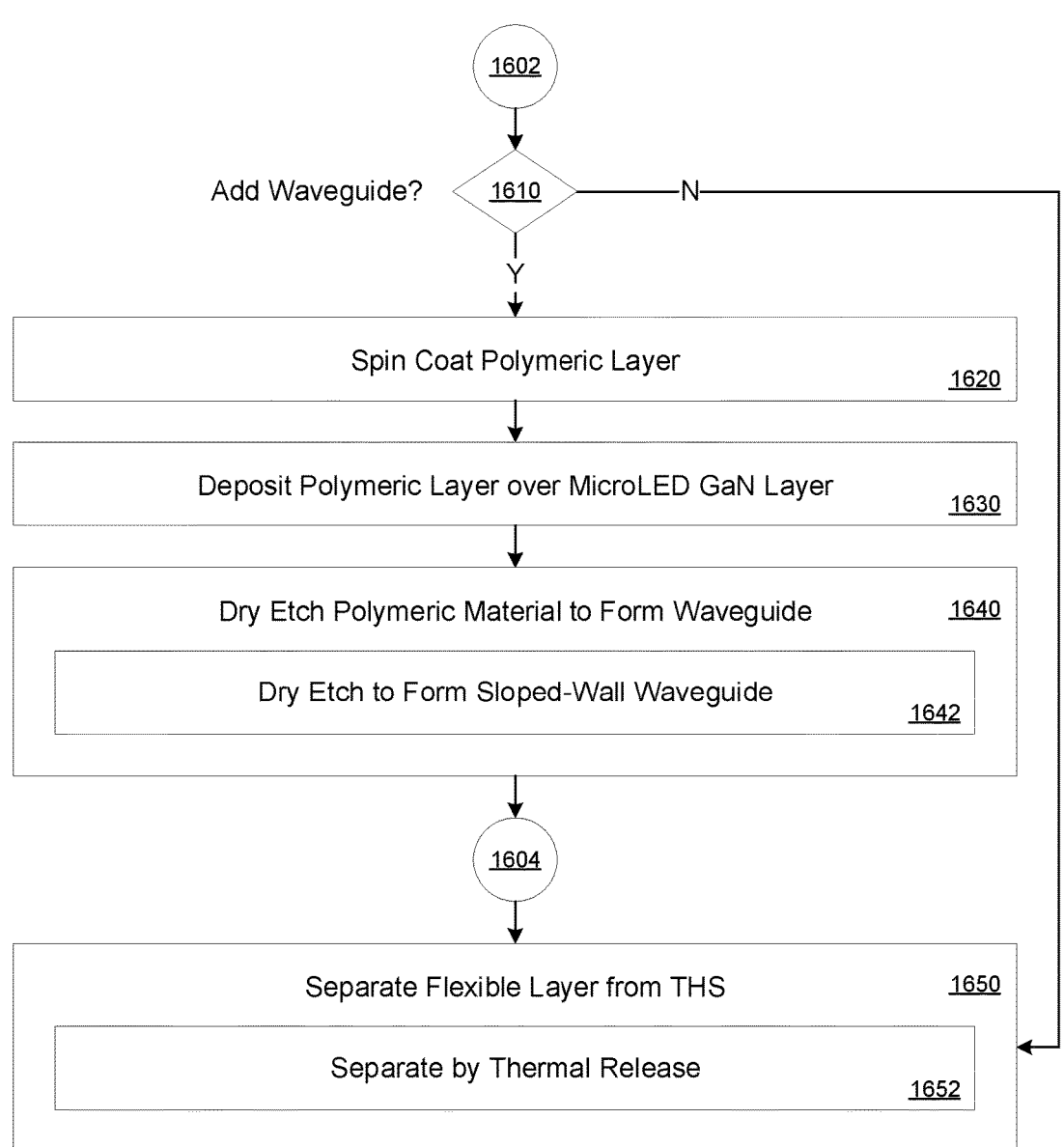
FIG. 16 illustrates an example method of manufacturing a flexible inorganic microLED display device, further to the example method of FIG. 15.

FIG. 16 illustrates an example method of manufacturing a flexible inorganic microLED display device, further to the example method of FIG. 15. In some implementations, the example device 100 is at least partially manufactured by method 1600 according to present implementations. In some implementations, the method 1600 begins at step 1602. The method 1600 then continues to step 1610.

At step 1610, the example system determines whether to add a waveguide to the planarized surface of the flexible layer. In accordance with a determination to add a waveguide to the planarized surface of the flexible layer, the method 1600 continues to step 1620. Alternatively, in accordance with a determination not to add a waveguide to the planarized surface of the flexible layer, the method 1600 continues to step 1650. At step 1620, the example system spin coats a polymeric layer. The polymeric layer can include SU-8. The method 1600 then continues to step 1630. At step 1630, the example system deposits a polymeric layer over the microLED GaN layer. The method 1600 then continues to step 1640. At step 1640, the example system dry etches the polymeric material to form a waveguide. As one example, the waveguide can be between 50 μm and 200 μm tall. In some implementations, step 1640 includes step 1642. At step 1642, the example system dry etches the polymeric material to form a sloped-wall waveguide. The method 1600 then continues to step 1604. At step 1604, the method 1600 continues to step 1650.

At step 1650, the example system separates the flexible layer from the third handler substrate. In some implementations, step 1650 includes step 1652. At step 1652, the example system separates the flexible layer from the third handler substrate by a thermal release process. In some implementations, the method 1600 ends at step 1650.

FIG. 17 illustrates a further example method of manufacturing a flexible inorganic microLED display device, in accordance with present implementations. In some implementations, the example device 100 is at least partially manufactured by method 1700 according to present implementations. It is to be understood that step of method 1700 can correspond at least partially to one or more corresponding steps of one or more of methods 900, 1000, 1100, 1200, 1300, 1400, 1500 and 1600. In some implementations, the method 1700 begins at step 920.

At step 920, the example system deposits titanium (Ti) and copper (Cu) layers on the wafer and the microLEDs by a sputtering process. The method 1700 then continues to step 930. At step 930, the example system deposits one or more resist layers on the wafer between one or more of the microLEDs. The method 1700 then continues to step 940. At step 940, the example system deposits one or more stress buffer layers on the wafer between resist layers. The method

1700 then continues to step 950. At step 950, the example system removes one or more of the resist layers and GaN layer between the microLEDS. The method 1700 then continues to step 1020.

At step 1020, the example system dices the wafer into one or more dies at gaps formed by the removal. The method 1700 then continues to step 1030. At step 1030, the example system bonds the dies to a carrier. The method 1700 then continues to step 1040. At step 1040, the example system separates the dies from the microLEDs by irradiation. The method 1700 then continues to step 1110. At step 1110, the example system bonds the microLEDs to a glass stamp. The method 1700 then continues to step 1120. At step 1120, the example system separates the microLEDs from the carrier by laser debonding. The method 1700 then continues to step 1130. At step 1130, the example system removes the stress buffer layers from the microLEDs. The method 1700 then continues to step 1140. At step 1140, the example system bonds microLEDs to a first handler substrate. The method 1700 then continues to step 1150. At step 1150, the example system separates the microLEDs from the glass stamp by laser debonding. The method 1700 then continues to step 1160.

Figure 18:
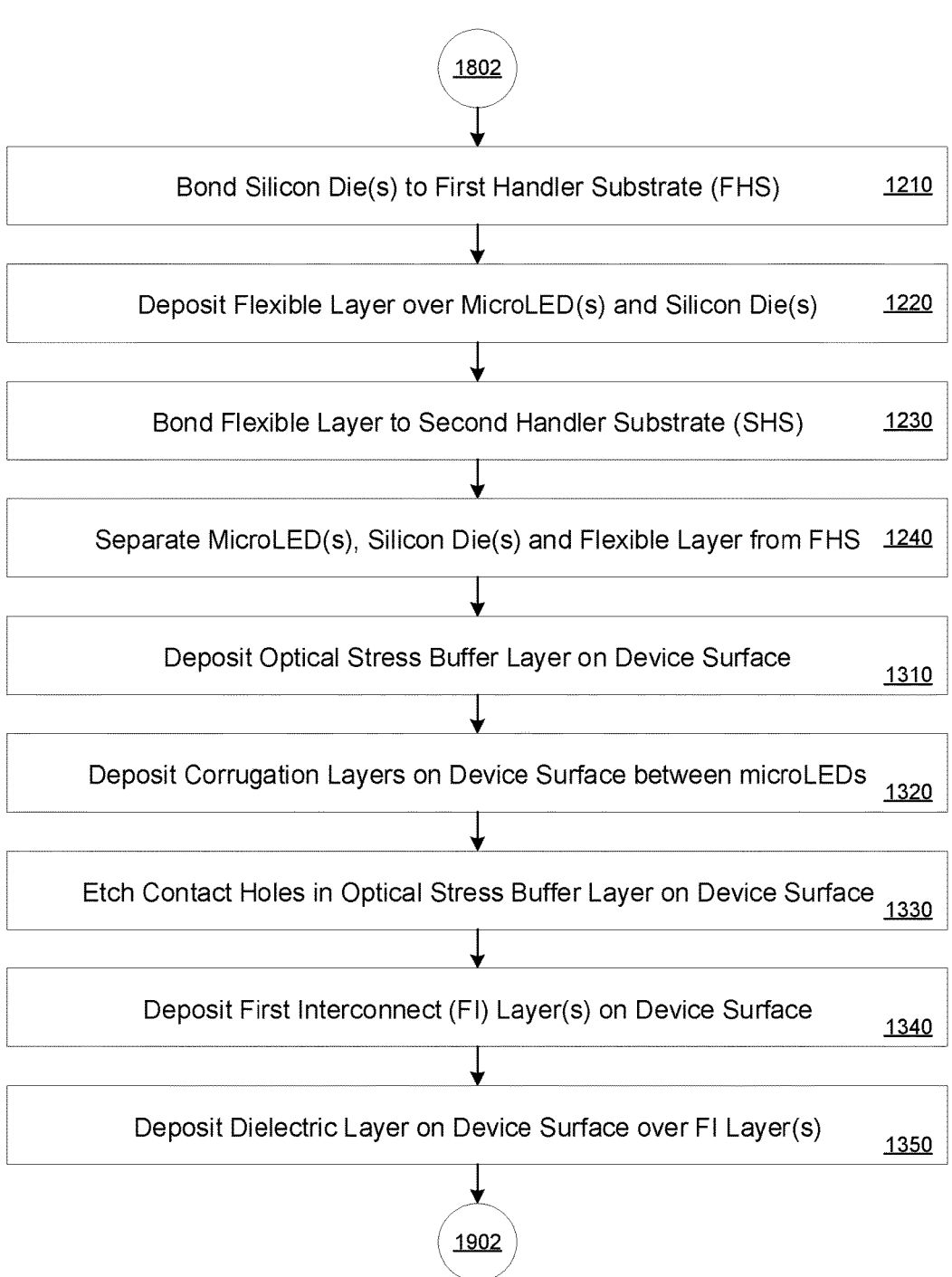
FIG. 18 illustrates a further example method of manufacturing a flexible inorganic microLED display device, further to the example method of FIG. 17.

FIG. 18 illustrates a further example method of manufacturing a flexible inorganic microLED display device, further to the example method of FIG. 17. In some implementations, the example device 100 is at least partially manufactured by method 1800 according to present implementations. It is to be understood that step of method 1800 can correspond at least partially to one or more corresponding steps of one or more of methods 900, 1000, 1100, 1200, 1300, 1400, 1500 and 1600. In some implementations, the method 1800 begins at step 1802. The method 1800 then continues to step 1210.

At step 1210, the example system bonds one or more silicon dies to the first handler substrate. The method 1800 then continues to step 1220. At step 1220, the example system deposits a flexible layer over the microLEDs and the silicon dies. The method 1800 then continues to step 1230. At step 1230, the example system bonds the flexible layer to a second handler substrate. The method 1800 then continues to step 1240. At step 1240, the example system separates the flexible sheet including the microLEDs, the silicon dies, and the flexible layer from the first handler substrate. The method 1800 then continues to step 1310.

At step 1310, the example system deposits an optical stress buffer layer on a surface of a flexible sheet having one or more surfaces of one or more of microLEDs and silicon dies exposed therethrough, adjacent thereto, proximate thereto, or the like. The method 1800 then continues to step 1320. At step 1320, the example system deposits one or more corrugation layers on the optical stress buffer layer between one or more of the microLEDs. The method 1800 then continues to step 1330. At step 1330, the example system etches one or more contact holes in the optical stress buffer layer. The method 1800 then continues to step 1340. At step 1340, the example system deposits a first interconnect layer over one or more of the optical stress buffer layer, the corrugation layers, and the contact holes. The method 1800 then continues to step 1350. At step 1350, the example system deposits a dielectric layer on the first interconnect layer and the optical stress buffer layer. The method 1800 then continues to step 1902.

Figure 19:
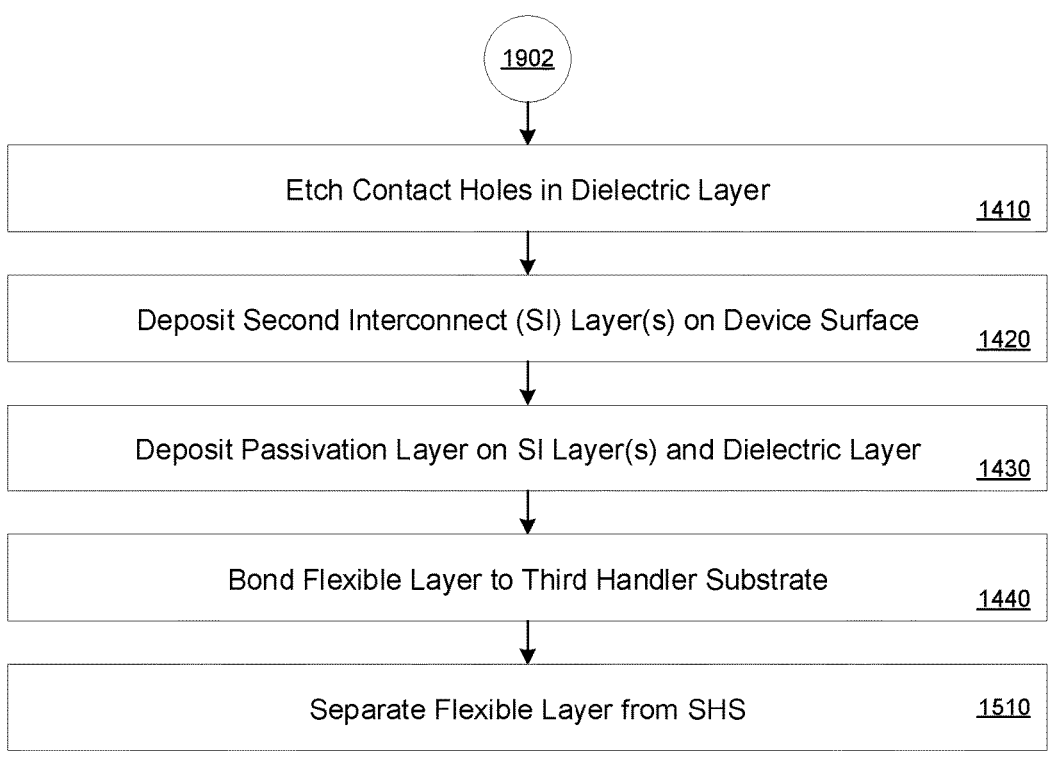
FIG. 19 illustrates a further example method of manufacturing a flexible inorganic microLED display device, further to the example method of FIG. 18.

FIG. 19 illustrates a further example method of manufacturing a flexible inorganic microLED display device, further to the example method of FIG. 18. In some implementations, the example device 100 is at least partially manufactured by method 1900 according to present implementations. It is to be understood that step of method 1900 can correspond at least partially to one or more corresponding steps of one or more of methods 900, 1000, 1100, 1200, 1300, 1400, 1500 and 1600. In some implementations, the method 1900 begins at step 1902. The method 1900 then continues to step 1410.

At step 1410, the example system etches one or more contact holes in the dielectric layer. The method 1900 then continues to step 1420. At step 1420, the example system deposits a second interconnect layer on the dielectric layer. The method 1900 then continues to step 1430. At step 1430, the example system deposits a passivation layer on the second interconnect layer and the dielectric layer. The method 1900 then continues to step 1440. At step 1440, the example system bonds the flexible layer of the flexible sheet to a third handler substrate. The method 1900 then continues to step 1510. At step 1510, the example system separates the flexible layer from the second handler substrate. In some implementations, the method 1900 ends at step 1510.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative implementations has been presented for purposes of illustration and of description. It is not intended to be exhaustive or limiting with respect to the precise form disclosed, and modifications and variations are possible in light of the above teachings or may be acquired from practice of the disclosed implementations. It is intended that the scope of the invention be defined by the claims appended hereto and their equivalents.

What is claimed is:

1. A method of manufacturing a flexible display device, the method comprising:
   bonding at least one silicon die to at least one including and one or more display elements to a first handler substrate;

depositing a flexible layer over the display elements and the at least one silicon die to form a display device structure, wherein and a first device structure surface comprising comprises a top surface of the flexible layer;

bonding the display device structure to a second handler substrate at the first device structure surface;

depositing at least one optical stress buffer layer on a bottom surface of the flexible layer, wherein a second device structure surface opposite to the first device structure surface comprises the bottom surface of the flexible layer;

depositing a first interconnect layer on the optical stress buffer layer; and separating the display device structure from the first handler substrate, subsequent to the depositing the flexible layer.

2. The method of claim 1, further comprising:

depositing one or more corrugation layers on the second device structure surface between corresponding ones of the portion of the display elements and the at least one silicon die.

3. The method of claim 1, further comprising:

etching one or more contact holes in the optical stress buffer layer on the first device structure surface.

4. The method of claim 1, further comprising:

depositing a dielectric layer on the first interconnect layer.

5. The method of claim 4, further comprising:

etching one or more contact holes in the dielectric layer.

6. The method of claim 5, further comprising:

depositing a second interconnect layer on the first interconnect layer at the contact holes and on the dielectric layer.

7. The method of claim 6, further comprising:

depositing a passivation layer on the second interconnect layer and the dielectric layer.

8. The method of claim 1, further comprising:

bonding the display device structure to a third handler substrate at the second device structure surface, subsequent to the depositing the first interconnect layer.

9. The method of claim 8, further comprising:

separating the display device structure from the second handler substrate at the first device structure surface, subsequent to the bonding the display device structure to the third handler substrate.

10. The method of claim 1, wherein the flexible layer comprises polydimethylsiloxane (PDMS).

11. The method of claim 1, wherein the first interconnect layer comprises copper.

12. The method of claim 1, wherein the second interconnect layer comprises copper.

13. The method of claim 1, further comprising:

depositing an optical structure on the first device structure surface and over at least one of the display elements.

14. The method of claim 13, wherein the optical structure comprises a lens.

15. The method of claim 13, wherein the optical structure comprises a waveguide.

16. A flexible display device, comprising:

an optical stress buffer layer having a first buffer layer surface and a second buffer layer surface opposite to the first buffer layer surface;

a plurality of display elements element disposed on the first buffer layer surface;

at least one silicon die disposed on the first buffer layer surface proximate adjacent to the plurality of display elements;

an interconnect layer disposed on the second buffer layer surface and in contact with at least one of the plurality of display elements element and the at least one silicon die; and a flexible layer disposed on the optical stress buffer layer, the plurality of display elements element, and the at least one silicon die, wherein the optical stress buffer layer is disposed on a dielectric layer.

17. The device of claim 16, further comprising:

a passivation layer, wherein the passivation layer is disposed on the dielectric layer.

18. The device of claim 16, further comprising:

a second interconnect layer, the second interconnect layer being disposed through the dielectric layer.

19. The method of claim 16, further comprising:

an optical structure disposed on the flexible layer and over at least one of the display elements.

20. The device of claim 19, wherein the optical structure comprises a lens.

21. The device of claim 19, wherein the optical structure comprises a waveguide.

22. The method of claim 16, wherein the flexible layer comprises polydimethylsiloxane (PDMS).

* * * * *